United States Patent [19]
Haraichi et al.

[11] Patent Number: 5,358,806
[45] Date of Patent: Oct. 25, 1994

[54] PHASE SHIFT MASK, METHOD OF CORRECTING THE SAME AND APPARATUS FOR CARRYING OUT THE METHOD

[75] Inventors: Satoshi Haraichi, Yokohama; Fumikazu Itoh, Fujisawa; Akira Shimase, Yokohama; Hiroshi Yamaguchi, Fujisawa; Junzou Azuma, Yokohama; Yasuhiro Koizumi, Sayama, all of Japan

[73] Assignee: Hitachi, Ltd., Tokyo, Japan

[21] Appl. No.: 854,861

[22] Filed: Mar. 19, 1992

[30] Foreign Application Priority Data

Mar. 19, 1991 [JP] Japan .................................. 3-054311
Jun. 28, 1991 [JP] Japan .................................. 3-184071
Dec. 12, 1991 [JP] Japan .................................. 3-328534

[51] Int. Cl.$^5$ ............................................. G03F 9/00
[52] U.S. Cl. .................................... 430/5; 250/492.2; 156/625; 156/643
[58] Field of Search ................... 430/5; 250/292.2; 156/625, 643

[56] References Cited
U.S. PATENT DOCUMENTS 4,367,119  1/1983  Logan et al. ......................... 430/313
5,045,417  9/1991  Okamoto ................................. 430/5

*Primary Examiner*—Marion E. McCamish
*Assistant Examiner*—Mark A. Chapman
*Attorney, Agent, or Firm*—Antonelli, Terry, Stout & Kraus

[57] ABSTRACT

A defect of a phase shift mask, which has a phase shifter disposed on a transparent substrate, formed into a predetermined pattern and acting to shift a phase of exposure light transmitted therethrough and an etching stopper disposed between the phase shifter and the transparent substrate, which is resistant to an etching to which the phase shifter is subjected and transparent for exposure light is corrected by selectively etching a defective portion of the phase shifter, having a lacking type defect, with respect to the etching stopper layer along the whole thickness of the phase shifter and by perforating a portion of the etching stopper layer and the transparent substrate positioned under the etched defective portion by a depth which corresponds to a magnitude of an optical path of the phase shifter for the exposure light, the etching being a reactive etching which uses charged particle beam and a reactive gas and, the bottom surface of a portion etched being flattened by utilizing a fact that the phase shifter is selectively etched.

25 Claims, 25 Drawing Sheets

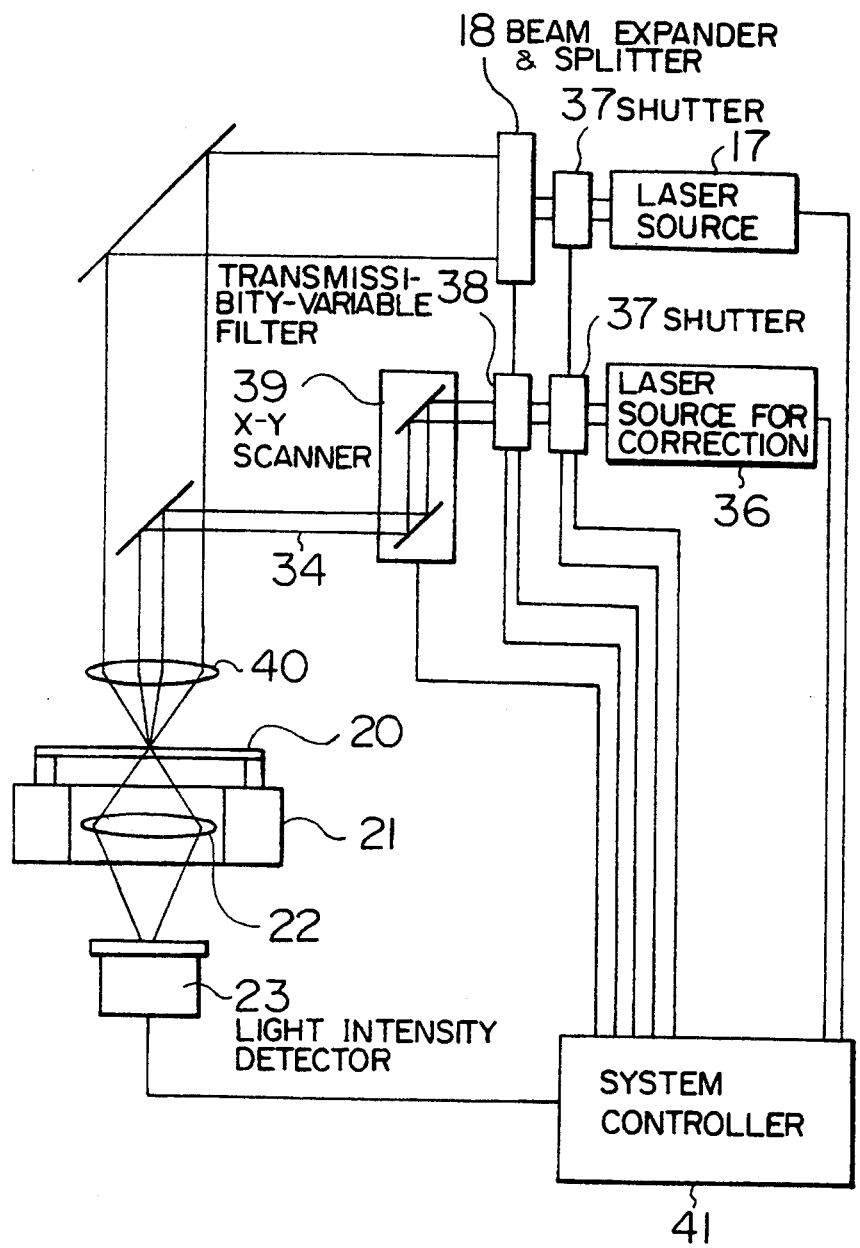

PHASE SHIFT MASK, METHOD OF CORRECTING THE SAME AND APPARATUS FOR CARRYING OUT THE METHOD

FIELD OF THE INVENTION

The present invention relates to a mask for use in a projection optical system, a method of correcting the mask and a mask correction apparatus for carrying out the method, and more particularly to a phase shift mask which is, on a transparent substrate, provided with a phase shifter formed into a predetermined pattern, a method of correcting the phase shift mask and a phase shift mask correction apparatus for carrying out the method.

Furthermore, the present invention relates to a method and an apparatus for monitoring a depth of a portion machined or etched with a focused ion beam for use in the mask correction operation.

DESCRIPTION OF THE RELATED ART

Recently, with a tendency of fining and highly integrating semiconductor devices, there has been a desire for projection exposure apparatus for use in a lithography process to transfer finer and higher resolution patterns. In order to improve the resolution of the projection exposure apparatus, a phase shift mask for making the phases of exposure light beams which have passed through two adjacent positions on a mask to be different has been tried to put into practice. An example of the phase shift mask is shown in FIG. 19A. Referring to FIG. 19A, reference numeral 1 represents a transparent substrate and 3 represents light shield patterns for forming a circuit pattern. Furthermore, phase shifters 4 are alternately formed on a region in which the circuit pattern will be formed. Since the phase of exposure light beam transmitted through a region in which the phase shifter 4 is present is shifted by $\pi$ from the phase of the exposure light beam transmitted through a region in which the same is not present, destructive interference of light takes place in the boundary of the pattern and thereby high resolution exposure can be performed. However, if a defect 5 is present in the phase shifter 4 as shown in FIG. 19B, the phase of this portion is undesirably shifted and the image of the defect 5 will undesirably be transferred to the surface of the wafer. Therefore, it is a critical factor to correct the defect 5 in order to put the phase shift mask into practice.

A technique for correcting the phase shift mask has been disclosed in "Phase shift, the practising elements of which such as inspection, correction and negative resist have been begun to appear" pp. 66, December 1990 issue of Nikkei Micro Devices.

If the defect 5 in the phase shifter 4 shown in FIG. 19B is simply removed by etching or the like, the phase of the transmitted light beam is further undesirably shifted and the defect cannot be corrected. An example of a correction method has been disclosed in the aforesaid report and will now be briefly described with reference to FIGS. 25A and 25B.

In the correction method disclosed in the report, the structure of the phase shift mask is, as shown in FIGS. 25A and 25B, formed into a double layer shifter structure constituted by forming light shielding patterns 3 made of thin Cr film on a glass substrate 1, depositing a sub-shifter 8 having a phase change characteristics of $\pi$ on the overall surface of the mask substrate 1 and forming the phase shifters 4 on required regions. Reference numeral 2 represents a transparent conductive layer. If there is a defect 5 in the phase shifter 4, the phase shifter 4 having the defect 5 and the sub-shifter 8 under the phase shifter 4 are removed as shown in FIG. 25B. As a result, the phase difference between the normal portion $4a$ of the phase shifters 4 and a corrected portion 9 is made to be $2\pi$, so that the defect 5 is corrected.

Since the phase of the exposure light beam is reversed by $\pi$ the thickness d of the phase shifter is obtained by the following equation:

$$d = \lambda/2\,(n-1) \qquad (1)$$

where $\lambda$ is a wavelength of the light in vacuum, and n is a refractive index of the phase shifter.

Assuming that wavelength $\lambda$ of the exposure light beam is 365 nm and refraction factor or index n of the phase shifter 4 is 1.44 which is the refraction factor of $SiO_2$, d is 415 nm. As a result, in order to correct the phase shifter 4 within a range of 10% or less of the phase difference $\pi$, the accuracy of the depth of machining or etching, that is the flatness of the bottom surface $9a$ of the etched portion must be $\pm$ several tens of nm (nano-meter) or less. However, in a case where the defect 5 of the phase shifter 4 is corrected by the aforesaid method, in addition to the defect portion 5, a portion around the defect 5 is removed undesirably. If the pit of the defect 5 is hundreds of nm, the machined bottom surface $9a$ is formed into a shape which is more or less similar to that of this step. If the defect 5 has an excessively rough surface, it is difficult to have a machining or etching depth within an accuracy of $\pm$ several tens of nm.

On the other hand, another method in which the defective portion 5 in the phase shifter 4 is removed and then the portion is filled at least partially by depositing a shifter material in the form of a local film is disclosed in Japanese Patent Application Laid-Open (Unexamined Publication) Nos. 3-105344 and 3-196041 laid-open on May 2, 1991 and Aug. 27, 1991 respectively. These two publications further disclose to provide an etching stopper layer between the phase shifter and the substrate. Japanese Patent Unexamined Publication No. 2-78216 (laid-open on Mar. 19, 1990) also discloses the provision of transparent etching stopper layer between a glass substrate and a phase shifter. As the stopper, nitride layer, and a stack of $MgF_2$ layer and $SiO_2$ layer are also disclosed. However, since the thickness of the deposited film must have an accuracy of $\pm$ several tens of nm similarly to the machining or etching process, the aforesaid accurate local film deposition cannot easily be performed.

Meanwhile, Japanese Patent Unexamined Publication No. 3-196041 further disclose to extend a hole formed at the defective portion into the substrate through the etching stopper layer to have a depth of hole or vacancy serving to shift a phase of light just as the phase shifter.

However, in the Publication No. 3-196041 as well as in the Publication No. 3-105344, the etching of the material to form the hole is performed by photolithography utilizing photo-resist.

In Japanese Patent Application Laid-Open No. 60-170938, a technology has been disclosed in which a portion of the substrate which corresponds to the defect portion in the light shielding pattern is irradiated with an ion beam to form a small ion-injected region or a small ion-milled region, so that the optical scattering characteristics of the subject portion of the substrate are changed and the defect of the light shielding pattern of the mask is thereby corrected. However, the method according to this disclosure is not a method for correcting a phase shifter which is a transparent pattern but is a method of giving the defect portion the light shielding characteristics by the small scattering effect. Therefore, it will not be practically applied to a defect of the phase shifter of an ordinary size or to an accurate correction corresponding to the shape (shape of the pit) of the defect of the phase shifter.

Hitherto, the depth of focused ion beam machining has been monitored by a method which utilizes the time in which the machining is performed, a method in which a change in secondary electrons, secondary ions or ion bombardment-excited light is observed or a method in which a change in a current through a specimen to be machined is observed. The method which utilizes the machining time is a method of discriminating the depth in accordance with an assumption that the depth of machining is in proportion to the machining time if the ion beam current is constant.

The method in which the change in the secondary electrons or the secondary ions is observed has been disclosed in Japanese Patent Application Laid-Open (Unexamined Publication) No. 58-202038. The method in which the change in the ion bombardment-excited light is observed has been disclosed in U.S. Pat. No. 4,874,947 (Focused ion beam imaging and process control by B. W. Ward and others).

The method in which the change in the specimen current is observed has been disclosed in FIG. 5 of "The focused ion beam as an integrated circuit restructuring tool", J. Vac. Sci. Technol. B4 (1), January/February, 1986.

The method in which the machining time is utilized cannot be employed as a monitor for accurately monitoring the depth of machining because the ion beam current is, to be exact, changed by a small quantity and the proportionality relationship between the depth of machining and the machining time is not always held due to a slight difference of a material to be machined, an influence of the re-deposition of the sputtered material or a difference in the scanning condition with the ion beam.

On the other hand, the methods in each of which the change in the secondary electrons, the secondary ions, the ion bombardment-excited light, or the specimen current is observed are methods of monitoring the aforesaid depth in accordance with the difference or change in the materials of the workpiece (specimen) to be machined. Therefore, if a part of a glass substrate made of silicon dioxide is machined, any of the aforesaid methods cannot be applied because the workpiece to be machined is made of a sole kind material.

SUMMARY OF THE INVENTION

The first object of the present invention is to provide a phase shift mask with a phase shifter capable of accurately and easily correcting a defect of the phase shifter regardless of the shape of the defect and a method for correcting the defect, as well as a defect-corrected phase shift mask.

According to a first aspect of the present invention, the object can be realized by disposing a transparent layer, which is proof against or resistant to an etching to which the phase shifter is subjected, between the phase shifter for reversing the phase of exposure light and a transparent substrate and by etching the phase shifter while using the transparent layer as an etching stopper to perform machining while preventing a generation of a step in the bottom surface of a portion to be machined, and subsequently by machining or milling the etching stopper layer and the glass substrate into a depth so that a phase of light transmitted through a thus machined or milled portion becomes identical with a phase of light transmitted through a non-defective portion of the phase shifter and the like.

The object can also be achieved by making the thickness of the transparent layer which is resistant to the etching, to which the phase shifter is subjected, to be a thickness with which the phase of exposure light is changed by $\pi$.

In a case of a reactive etching in which a charged particle beam and a reactive gas are combined with each other is employed to etch a defective portion of the phase shifter, a gas which reacts on the material of the phase shifter but which does not react on the transparent layer serving as the etching stopper is used, so that the transparent layer is not substantially etched when the defect of the phase shifter is removed. Therefore, the bottom surface of machined defective portion on the transparent layer can be made smooth and thereby the accuracy in the depth of machining can be improved.

By making the thickness of the transparent layer serving as the etching stopper to be a thickness with which the phase of exposure light is changed by $\pi$, an accuracy in the depth of machining with which the phase of exposure light is shifted by $2\pi$ in the defective portion can easily be obtained from the following process, that is removing a defective portion of the phase shifter by the aforesaid method and then removing a portion of the transparent layer by using a gas which does not react on the glass substrate but which reacts on the transparent layer.

More specifically, according to a first aspect of the present invention, the first object can be realized by a method of correcting a defect of a phase shift mask having a phase shifter disposed on a transparent substrate, formed into a predetermined pattern and acting to shift the phase of transmitted light therethrough and an etching stopper layer disposed between the phase shifter and the transparent substrate, which is resistant to an etching to which the phase shifter is subjected and transparent for exposure light, wherein the method comprises steps of:

etching a defective portion of the phase shifter, having a lacking type defect selectively with respect to the etching stopper layer along a whole thickness of the phase shifter; and perforating or milling a portion of the etching stopper layer and the transparent substrate positioned under the etched defective portion by a depth which corresponds to a magnitude of an optical path of the phase shifter for exposure light, and wherein, the step of etching the defect of the phase shifter is chemically reactive etching which uses a charged particle beam and a reactive gas and, in the etching step, the bottom surface of a portion etched is flattened by utilizing a fact that the phase shifter is selectively etched.

It is preferable that the step of perforating the etching stopper includes a step in which a charged particle beam and a reactive gas for selectively etching the etching stopper layer with respect to the transparent substrate are used to selectively and chemically reactively etch the portion of the etching stopper layer under the defective portion of the phase shifter along the whole thickness of the stopper layer.

Preferably, the etching stopper layer is made of a material selected from a group consisting essentially of a metal oxide and a metal halide. It is preferable that the metal oxide is a material selected from a group consisting essentially of $Al_2O_3$ and $Ta_2O_5$. Preferably, the metal halide is a material selected from a group consisting essentially of $MgF_2$ and $CeF_3$.

It is preferable that the reactive gas for use in the step of chemically reactively etching the defective portion of the phase shifter is fluorine type gas.

According to an embodiment of the present invention, the method can be applied to correct a so-called "residual type defect" in place of the "lacking type defect" when it is modified as required. In this case, a method according to a first aspect of the present invention includes a process of selectively etching a residual type defective portion made of the material of the phase shifter deposited on a portion of the transparent substrate except for the predetermined pattern with respect to the etching stopper layer.

It is preferable that the step of etching the residual type defect is chemically reactive etching which uses a charged particle beam and a reactive gas and, in the etching step, the bottom surface of a portion etched is flattened by utilizing a fact that the phase shifter is selectively etched.

According to another embodiment of the present invention, the aforesaid method includes:

a step of selectively etching a defective portion, having a lacking type defect, of the phase shifter with respect to the etching stopper layer along the whole thickness of the defective portion; and a step of selectively etching a portion of the etching stopper layer positioned under the etched defective portion with respect to the transparent substrate.

Preferably, a phase shift mask according to the first aspect of the present invention is a phase shift mask comprising: a transparent substrate and a phase shifter disposed on the transparent substrate, formed into a predetermined pattern and acting to shift a phase of light transmitted therethrough by a predetermined magnitude, wherein an etching stopper layer which is resistant to an etching to which the phase shifter is subjected and transparent for the exposure light is disposed between the phase shifter and the transparent substrate, and wherein the etching stopper layer is made of a material selected from a group consisting essentially of $Al_2O_3$, $Ta_2O_5$ and a metal halide.

It is preferable that the etching stopper layer has a thickness corresponding to a negligible magnitude of an optical path for the exposure light in the etching stopper as compared with the magnitude of the optical path for the exposure light in the phase shifter. Alternatively, it is preferable that the etching stopper layer has a thickness which realizes the length or magnitude of an optical path for exposure light in the etching stopper layer which is the same as the length or magnitude of the optical path for the exposure light in the phase shifter.

Preferably the metal halide is a material selected from a group consisting essentially of $MgF_2$ and $CeF_3$.

It is preferred that a defect-corrected or defect-free phase shift mask according to the first aspect of the present invention comprises: a transparent substrate and a phase shifter disposed on the transparent substrate, formed into a predetermined pattern and acting to shift a phase of light transmitted therethrough by a predetermined magnitude, wherein an etching stopper layer which is resistant to an etching to which the phase shifter is subjected and transparent for the exposure light is disposed between the phase shifter and the transparent substrate, the etching stopper layer having a thickness corresponding to a negligible magnitude of an optical path for the exposure light as compared with the magnitude of the optical path for the exposure light in the phase shifter, wherein the mask has a hole extending from an upper surface of the phase shifter into the substrate through the etching stopper layer, a depth of the hole corresponding to a magnitude of an optical path of the phase shifter for the exposure light.

Preferably the etching stopper layer is made of a material selected from a group consisting essentially of a metal oxide and a metal halide.

It is preferable that the metal oxide is a material selected from a group consisting essentially of $Al_2O_3$ and $Ta_2O_5$.

Preferably the metal halide is a material selected from a group consisting essentially of $MgF_2$ and $CeF_3$.

Another object of the invention is to provide a monitor capable of achieving a correct machining machined depth, more specifically within an accuracy of 1 μm even in a portion of a mask material made of single material upon correcting the mask.

According to the invention, in order to accomplish said another object, a laser beam is irradiated or applied to a surface to be machined by a focused ion beam during the machining a laser beam reflected from the surface to be machined during machining and a reference laser beam reflected by a surface which is different from the surface to be machined are allowed to interfere with each other to measure a change in the light interference during the machining, so that the depth of machining is monitored.

Since the laser beam reflected from the surface to be machined is observed during the machining, the change in the position of the machined surface of the mask can be observed even if there is no change in the material of a portion which is subjected to the machining. Furthermore, the interference of the laser beam is utilized, so that bright and dark portions are generated in each proceeding of the machining by ¼ wavelength. Therefore, in a case where light, the wavelength of which is 0.5 μm, is used, the depth of machining within an accuracy of about 0.1 μm can be obtained. Typically, the accuracy in the depth of the machined hole is required to be approximately 1/10 of the wavelength of the laser beam for detecting the depth of the hole. This requirement is achieved by detecting laser beam reflected from a bottom surface of the hole, which changes periodically according to the change in the depth of the hole, by obtaining, from a rate of change in the detected quantity of light, relationship between a machining time and the machined depth, and by determining the machining time.

More specifically, according to the first aspect of the present invention, the aforesaid another object can be realized by a method of machining, with a focused ion beam, a phase shift mask having a phase shifter disposed on a transparent substrate, formed into a predetermined pattern and acting to shift the phase of exposure light transmitted therethrough and an etching stopper layer disposed between the phase shifter and the transparent substrate, which is resistant to an etching to which the phase shifter is subjected and transparent for the exposure light, comprising steps of: in order to correct a lacking type defect of the phase shifter, making a laser beam incident upon a surface of the mask which is being subjected to perforating with the focused ion beam;

obtaining an interfered light by allowing a light beam reflected, by the surface to be perforated, of the incident laser beam and a reference laser beam obtained by reflecting the incident laser beam at a reference surface which is different from the surface to be perforated to interfere with each other; and monitoring a depth of perforation by detecting a change in the interfered light during perforating.

The aforesaid method is carried out by a focused ion beam machining apparatus for perforating a defective portion of a phase shift mask with a focused ion beam in order to correct a lacking type defect of a phase shifter of the phase shift mask having the phase shifter disposed on a transparent substrate, formed into a predetermined pattern and acting to shift the phase of light transmitted therethrough and an etching stopper layer disposed between the phase shifter and the transparent substrate, which is resistant to an etching to which the phase shifter is subjected and transparent for exposure light, wherein the focused ion beam machining apparatus comprises:

a laser source;

a first reflecting mirror disposed adjacent to an axis of the focused ion beam to make incident a laser beam issued from the laser source upon a surface of the mask to be perforated and to reflect light reflected by the surface to be perforated;

a second reflecting mirror disposed stationarily with respect to the mask and receives a portion of the laser beam issued from the laser source and reflects it as reference light;

a third reflecting mirror for guiding light reflected by the first reflecting mirror to interfere with reference light reflected by the second reflecting mirror; and a detector for detecting the interference.

It is preferable that the first reflecting mirror is structured to reflect incident light issued from the laser source to focus onto the surface of the mask to be perforated.

A second object of the present invention is to provide a mask correction method capable of accurately and easily correcting a defect of a phase shifter of a phase shift mask and an apparatus for carrying out the method.

The defect present in the phase shifter arises a problem because the phase of light which has passed through the defective portion is undesirably shifted. Therefore, the defect can be corrected by making the difference between the phase of light through the normal portion and that through the defective portion to be eliminated. The aforesaid object of easily performing the correction of the phase difference can be realized by locally changing the refraction index in the defective portion and by correcting the phase difference in transmitted light in place of physically changing the length of the optical path in the defective portion by means of machining or depositing.

Meanwhile, it has been proposed to change the refractive index of an end of an optical fiber, to provide a self-focusing property or lens effect by implantation of impurities by means of ion beam irradiation or to have a lens effect by generating thermal strain, of a Gaussian distribution, in a material by applying eximer laser. However, it has not been proposed to apply such refractive index-changing art to correction of defect or to a mask.

In the second aspect of the present invention, the aforesaid change in the refraction index taken place due to the applied ion beam or the laser beam is utilized in correction of a phase shift mask. An energy beam is applied to the defective portion of the phase shifter of the phase shift mask to change the refraction index of the defective portion, so that the defect is corrected or substantially repaired.

When the ion beam is applied to a transparent material, an optical density of the material is changed due to the effect of the implantation of impurities and thereby the refraction index is changed. Now, conditions for performing the phase difference correction in which the defective portion of the phase shifter is irradiated with a focused ion beam will now be considered. Assuming that the depth of a pit of the defective portion is $d_0$, the refraction index of the original material is n, the thickness of a region or layer to which the ion beam is implanted is $d_i$ and the refraction index of the ion-implanted layer is $n_i$, the condition for making the phase difference between the normal portion and the defective portion to be zero by applying the ion beam is expressed by the following Equation (2):

$$\frac{n \cdot (d_0 + d_i)}{\lambda} = \frac{n_i \cdot d_i}{\lambda} \qquad (2)$$

Therefore, the acceleration energy of the focused ion beam is changed to control the depth or thickness $d_i$ and the current density is changed to control the refractive index $n_i$, so that the Equation (2) is met and the defect is corrected.

When the transparent material is irradiated with a laser beam of sufficiently large power, the optical density of the material is changed due to thermal strain and thereby the refraction index is changed. The condition for performing the phase difference correction by applying the laser beam to the defective portion of the phase shifter can be considered similarly to the case in which the focused ion beam is used. Assuming that a dept of lacking type defect is $d_0$, the refraction index of the original material is n, the thickness of the thermal strain layer realized by the application of the laser beam is $d_e$ and the refraction index of the thermal strain layer is $n_e$, the condition for correcting the phase difference is expressed similarly by the following Equation (3):

$$\frac{n \cdot (d_0 + d_e)}{\lambda} = \frac{n_e \cdot d_e}{\lambda} \qquad (3)$$

Therefore, in the case where the pulse laser beam is used, the width of the pulse and the power of laser are changed to control the thickness $d_e$ and refractive index $n_e$, so that Equation (3) is met and the defect is corrected.

More specifically, according to the second aspect of the present invention, the second object can be achieved by a method of correcting a phase shift mask having a transparent substrate and a phase shifter disposed on the transparent substrate and formed into a predetermined pattern and having, in the phase shifter, a lacking type defect, wherein a refraction index changing step is performed in order to raise the refraction index of a lower region under the defect.

It is preferable that the refraction index changing step is performed by implanting ions into the lower region by applying an ion beam onto the lower region, or by generating thermal strain in the lower region by applying a beam for giving thermal energy to the lower region.

Preferably, the lower region is a region of the phase shifter positioned in a bottom portion of the lacking type defective portion of the phase shifter. Alternatively, it is preferable that a bottom portion of the lacking type defect portion is etched until it is made substantially flat and a portion of the phase shifter which forms the flattened bottom portion is subjected to the refraction index changing. Preferably, a portion of the phase shifter positioned below the defect is removed by etching and a portion of the transparent substrate which is exposed due to the removal is subjected to the refraction index changing. It is preferable that the transparent substrate has a transparent conductive layer on the exposed side and the exposed portion of the transparent conductive layer is subjected to the refraction index changing.

According to the second aspect of the present invention, the aforesaid second object can be achieved by a phase shift mask correction apparatus comprising:

an energy beam source for emitting an energy beam;

a convergent optical system for converging or focusing the energy beam emitted from the beam source;

a stage for movably supporting a phase shift mask in a plane perpendicular to a direction in which the energy beam runs for a purpose of applying the energy beam converged or focused by the convergent optical system to the phase shift mask which has a transparent substrate and a phase shifter disposed on the transparent substrate and formed into a predetermined pattern;

an exposure light applying or projecting system which applies light to the phase shift mask on the stage so as to project light which has passed through the mask onto a member to be exposed;

an exposure light detection system for detecting light which has passed through the mask; and a controller for controlling the operations of the energy source, the convergent optical system, the stage, the exposure light projecting system and the exposure light detection system, wherein the controller is adapted to control the energy beam source, the convergent optical system and the stage to change the refraction index of a lower region, of the mask, under a defective portion of the phase shifter by applying the energy beam emitted from the energy beam source to the lower region of the mask on the stage and the exposure light applying system and the exposure light detection system to observe a change in the refraction index of the lower region by detecting light which has issued from the exposure light applying system and has passed through the mask.

It is preferable that the convergent optical system has shape-adjusting means for adjusting a horizontal cross sectional shape of the energy beam.

Preferably, the convergent optical system has focusing and scanning means for focusing the energy beam into a sufficiently small area as compared with an area of the lower region and scanning the focused beam over the lower region, and setting means for setting at least either of a beam scanning speed and an intensity of the beam in the region to be scanned.

According to the second aspect of the present invention, the phase shift mask comprises a transparent substrate and a phase shifter disposed on the transparent substrate, formed into a predetermined pattern and acting to shift the phase of light transmitted therethrough, wherein the transparent substrate or the phase shifter partially includes a portion the refraction index of which is changed.

It is preferable that the transparent substrate has a body of the transparent substrate and a transparent conductive layer formed on the body.

BRIEF DESCRIPTION OF THE DRAWINGS

FIG. 9 simply illustrates an example of the correction apparatus for carrying out the correction method according to the sixth embodiment of the one aspect of the present invention;

DETAILED DESCRIPTION OF PREFERRED EMBODIMENTS

Embodiments of the present invention will now be described with reference to the drawings.

Figure 1A:
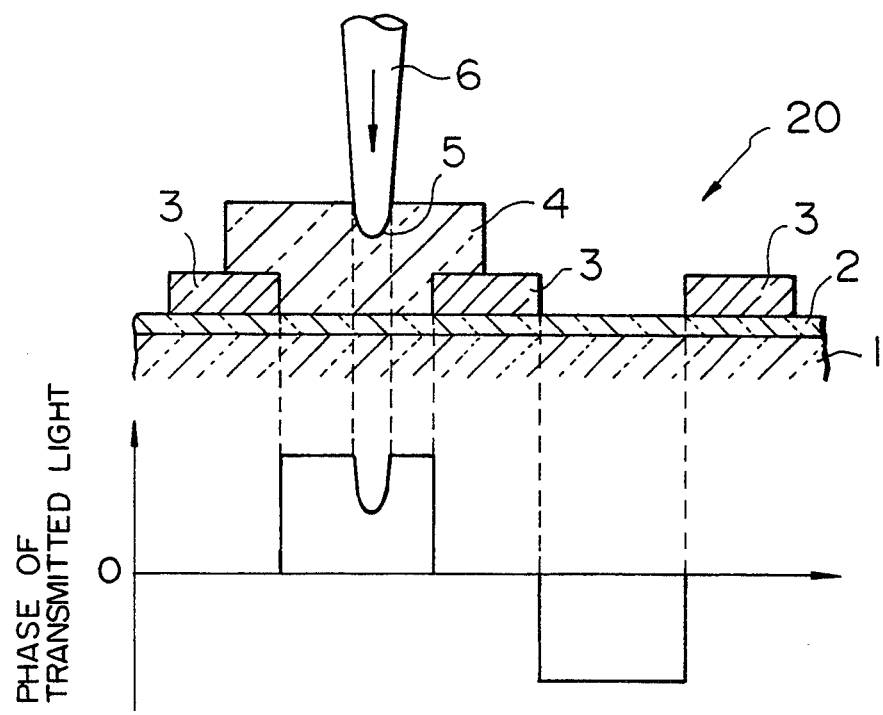
FIGS. 1A and 1B are schematic views which illustrate a first embodiment of a correction method according to one aspect (second aspect) of the present invention.
Figure 1B:
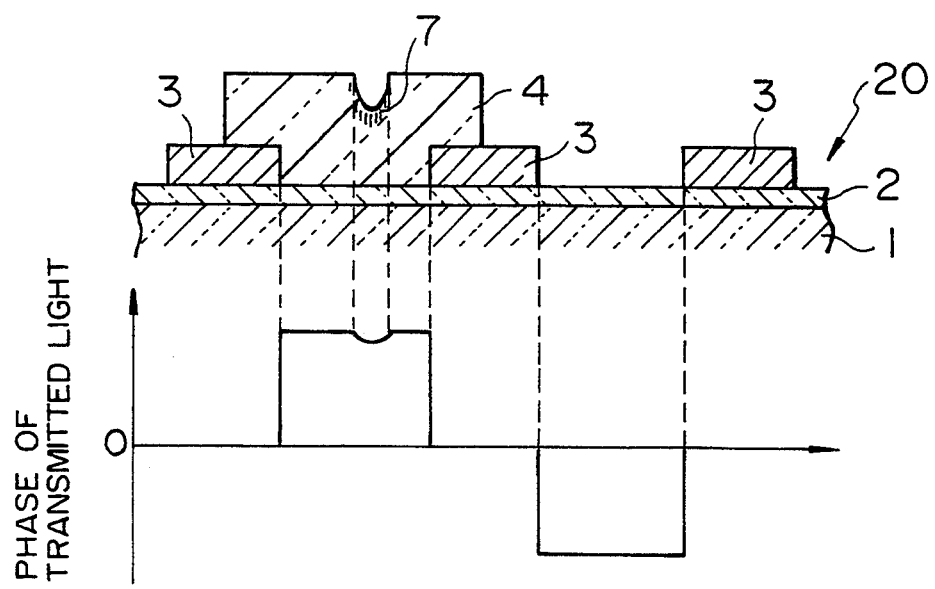

First, a method according to one aspect (the second aspect) of the present invention will now be described in which a refraction index of a defective portion of a phase shifter of a phase shift mask is changed and thereby an undesired phase difference generated due to the defect is reduced. With reference to FIGS. 1A and 1B, a method according to a first embodiment of the present invention will now be described in which the defect of the phase shifter is irradiated as a whole with a focused ion beam and it is corrected. Referring to FIGS. 1A and 1B, a phase shift mask 20 comprises a transparent substrate 1, a transparent conductive layer 2, light shield patterns 3 and a phase shifter 4. For example, a mask for an integrated circuit has the light shield patterns 3 each having typically the width and interval of about 1.5 μm and about 1.5 μm, which may be shorter or longer than these value. Reference numeral 5 represents a lack type defect of the phase shifter 4 where a part of the material for the phase shifter 4 is lacking. The presence and the position of the defect 5 are detected, for example, by analyzing an optical image thereof through an optical microscope or by analyzing an image of secondary particles such as electrons or ions emitted therefrom upon scanning of charged particles thereon, while the distribution of the depth of the defect 5 are detected, for example, by a phase contrast microscope or scanning tunnel microscope utilizing interference. If the phase shifter 4 has the lack type defect 5 as shown in FIG. 1A, the phase of light which has passed through the defective portion 5 is considerably shifted as described above. In this embodiment, a focused ion beam 6 is therefore formed into the shape of the defect 5 and the defective portion 5 is irradiated as a whole with the focused ion beam 6. The major portion of the defect 5 is in the form of a dish, the depth $d_0$ of which becomes larger in the direction toward its central portion.

Modifying the equation (2) expressing the phase difference correction condition with the ion beam irradiation, following equation (4) is obtained:

$$d_0 = \left( \frac{n_i}{n} - 1 \right) \cdot d_i. \tag{4}$$

When the acceleration energy is made substantially constant within a diameter of the focused ion beam 6, also depth $d_i$ of an ion-implanted layer 7 is made constant. On the other hand, the current density of the beam has a substantially two-dimensional Gaussian distribution in a region of the diameter of the beam and refraction index $n_i$ of the ion-implanted layer 7 depending upon the impurity density is enlarged in a direction toward the central portion of the beam. This fact effects in a direction in which the defective shape having larger depth $d_0$ toward the central portion is cancelled or compensated, so that the correction condition expressed by Equation (4) can be substantially met in all of the regions in the defect (in the diameter of the beam). As a result, only by collectively applying the focused ion beam 6 to the defect 5, the phase difference of the defective portion 5 can be corrected as shown in FIG. 1B.

As a method of forming a cross-sectional shape of the focused ion beam 6 into a shape of the defect 5 in a plane parallel with a principal face of the substrate 1, a method may be employed in which an image of a variable slit aperture device is focused and projected or a method may be employed in which it is electrically adjusted with voltage to be applied to deflector stigma electrodes.

As a second embodiment of the present invention, a method will now be described will now be described with reference to FIGS. 2A and 2B in which a thinned focused ion beam 6a is applied to scan over the defect 5 of the phase shifter 4 to correct the defect 5.

Figure 2A:
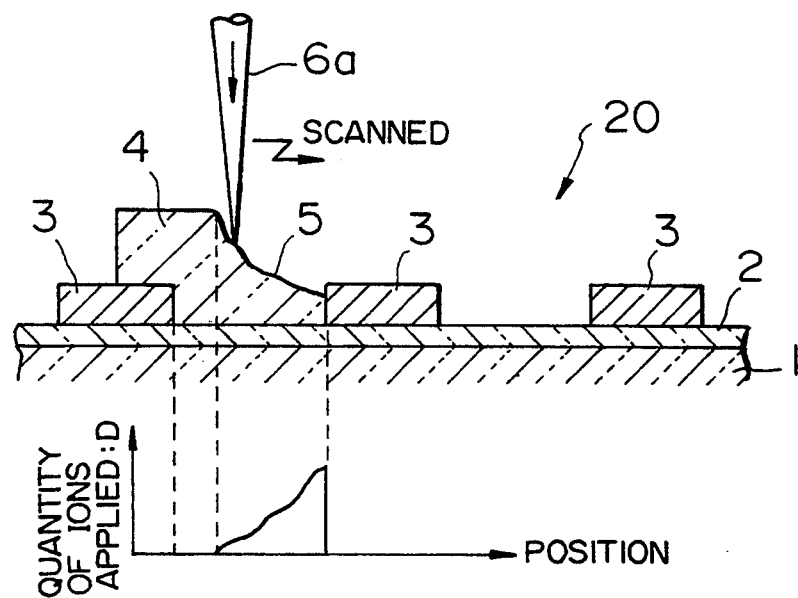
FIGS. 2A and 2B schematically illustrate a second embodiment of the correction method according to the one aspect of the present invention.

If the defect 5 on the phase shifter 4 is very large and the distribution of depth $d_0$ of the defect 5 is asymmetric as shown in FIG. 2A, the correction by the method according to the first embodiment cannot easily be performed. Therefore, this embodiment uses the thinned focused ion beam 6a which is sufficiently thinned is applied to scan over the defect 5. Assuming that the distribution of defect depths $d_0$, depth $d_i$ of the ion-implanted layer 7 at the time of the correction and the refraction index $n_i$ in a plane parallel with the principal face of the substrate 1 are respectively:

$$d_0(x, y), d_i(x, y) \text{ and } n_i(x, y),$$

the correction conditions can be expressed by the following equation from the Equation (4):

$$d_0(x,y) = \left[ \frac{n_i(x,y)}{n} - 1 \right] \cdot d_i(x,y) \tag{5}$$

When the acceleration energy is made constant in order to maintain the diameter of the beam to be constant, $d_i(x, y) = d_i$, i.e. constant. Since $n_i$ depends upon the impurity density, that is irradiated or applied ion quantity D, letting $n_i = f(D)$, the conditions required for the distribution D (x, y), in the plane, of the applied ion quantity D can be, from Equation (5), expressed by the following equation:

$$D(x,y) = f^{-1}\left(n \cdot \left(\frac{d_0(x,y)}{d_i} + 1\right)\right). \quad (6)$$

The relationship $n_i = f(D)$ (monotonic increase) held between $n_i$ and D can be previously obtained from an experiment for a standard sample. At the time of correcting the defect 5, the defect depth distribution $d_0$ (x, y) is measured by a light interference method or the like and the Equation (6) is used to obtain the applied ion quantity distribution D (x, y) required for the correction operation. In accordance with the obtained D (x, y), the focused ion beam 6 is applied. Thus, the phase difference in the defective portion can be corrected as shown in FIG. 2B.

As a method of setting D (x, y), a fact that the focused ion beam quantity D is in proportion to a beam application time, that is, in inverse proportion to a scanning speed v is utilized and the scanning speed v at each point in the defect 5 may be determined to be in inverse proportion to the obtained D (x, y). On the other hand, in a case where the change in the diameter of the beam is negligible, the beam current value at each point may be determined to be in proportion to D (x, y). As a method of setting a adjusting the beam current value, a method may be employed which uses a variable aperture device or a zoom lens to be described later.

Then, the structure of an apparatus for carrying out the method of FIGS. 1A and 1B or FIGS. 2A and 2B will now be described with reference to FIG. 3. Referring to FIG. 3, reference numeral 10 represents an ion source, 11 represents an extraction electrode, 12 represents a focusing or convergent lens, 12a represents an aperture-variable slit or variable slit aperture device, 13 represents blanking electrodes, 14 represents a blanking aperture device, 15 represents a focusing or convergent lens, 16 represents deflector stigma electrodes, 17 represents a laser oscillator (laser source), 18 represents a beam expander and splitter, 19 represents a parabolic mirror, 20 represents the phase shift mask, 21 represents a stage, 22 represents an imaging lens, 23 represents a light intensity detector, 24 represents an ion beam chamber, 25 represents a power supply for the ion beam, 26 represents an ion beam deflection controller and 27 represents a system controller for controlling the overall apparatus.

In the aforesaid structure, an ion beam 6 emitted from the ion source 10 is converged by the front and rear convergent lenses 12 and 15 so as to be applied to the surface of the phase shift mask 20. At this time, the voltage applied to the blanking electrodes 13 is used to turn on/off the beam. Furthermore, the aperture of the variable slit aperture device 12a or the voltage applied to the deflector stigma electrodes 16 constituted by circumferentially equidistantly disposed multiple (e.g. 8) electrodes is controlled to adjust the shape of the beam. The voltage applied to the deflector stigma electrodes 16 is used to set the scanning speed. The acceleration energy is set by the voltage applied from the power supply 25 to the ion source 10. All of the diameter of the converged beam and the beam current value in a case where each of the front and rear convergent lenses 12 and 15 or the rear convergent lens 15 is a zoom lens are set by the voltage applied from the power supply 25 for the ion beam to each electrode of the convergent lenses 12 and 15. In a case where the ion beam is thinned, as shown in FIGS. 2A and 2B, it is thinned by, for example, the variable slit aperture device 12a and the convergent lenses 12 and 15 and scanning of the wide defective portion 5 with the ion beam 6a is controlled by the voltage applied to the deflector stigma electrodes 16. In a case where the ion beam is adjusted to fit the shape of the defective portion 5 as shown in FIGS. 1A and 1B, the variable slit aperture device 12a or the deflector stigma electrodes 16 is or are used to shape the ion beam.

On the other hand, the laser beam emitted from the laser oscillator 17 is split into two parts 17a, 17b by the beam expander & splitter 18, the two parts 17a, 17b being then imaged on the phase shift mask 20 by the parabolic mirror 19. Two beams 17a, 17b which have passed through the phase shift mask 20 are again imaged by the imaging lens 22 to detect the interfered light intensity by the detector 23. As a result, the refraction index of a desired portion on the phase shift mask 20 can be indirectly measured. Furthermore, the laser beam split into two parts 17a, 17b are applied to the defective portion 5 and the normal or non-defective portion of the mask and the transmitted laser beams are made to interfere with each other, so that monitoring of the correction of the phase difference of the defect can be performed. In addition, the laser beam split into the two parts are applied to the portion which is irradiated with the ion beam and the portion which is not irradiated with the same to make the transmitted laser beams to interfere with each other, so that the relationship $n_i = f(D)$ between $n_i$ and D can be measured.

Figure 3:
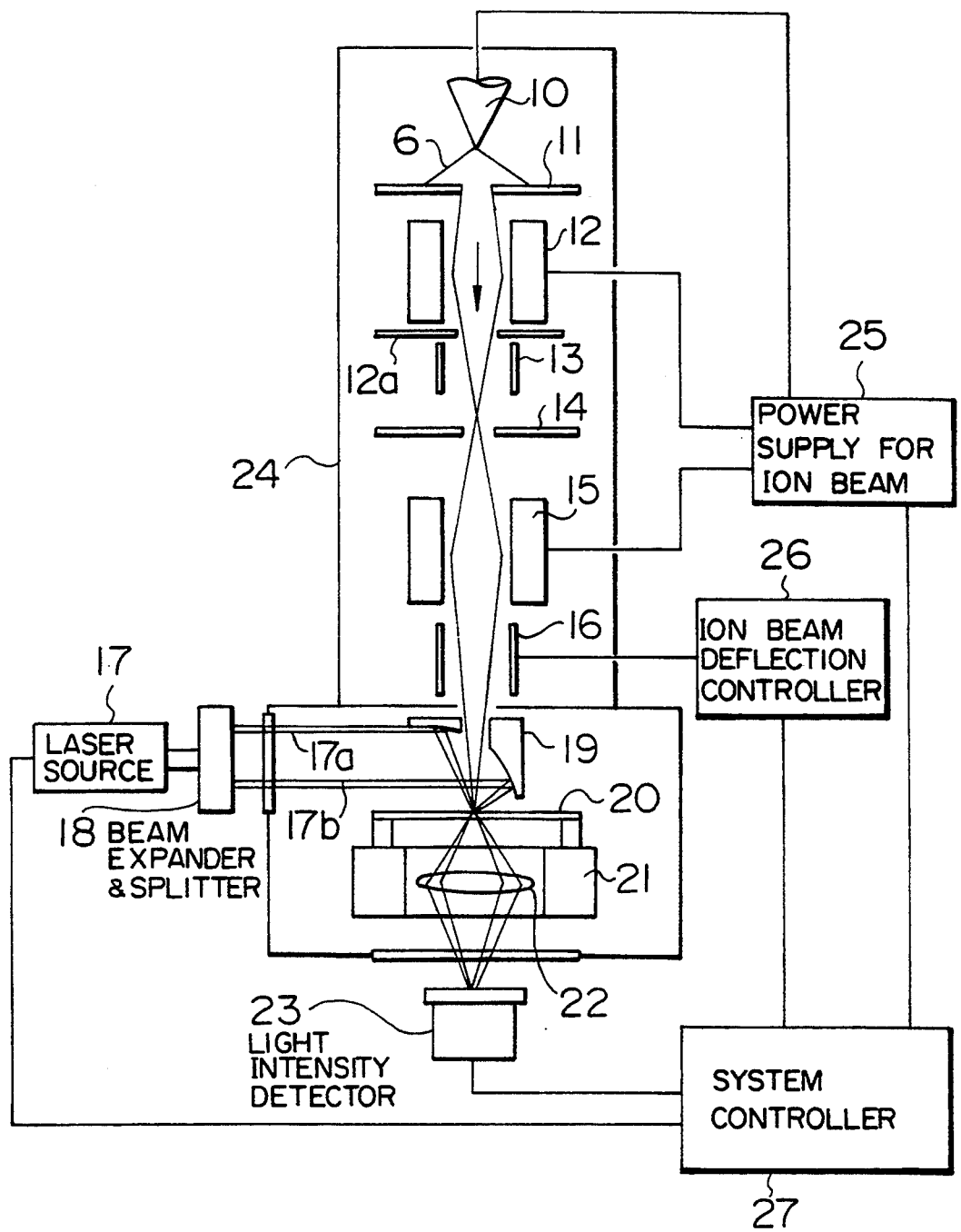
FIG. 3 simply illustrates an example of a correction apparatus for carrying out the correction method according to the second embodiment of the one aspect of the present invention.
Figure 3A:
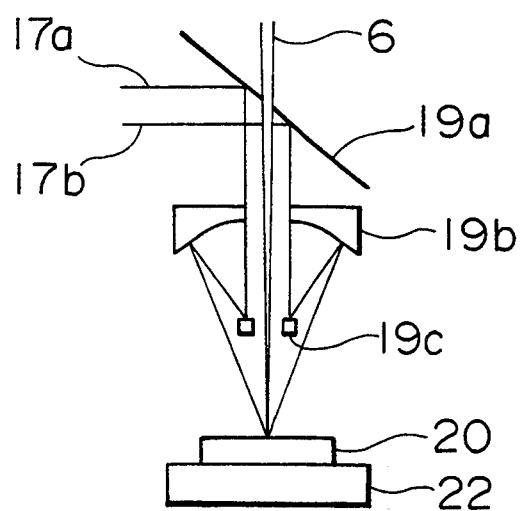
FIG. 3A is a modification of a part of the apparatus of FIG. 3.

In irradiating the mask 20 with the laser beam, a method may be employed which uses a normal imaging lens to converge and obliquely irradiate light on the mask 20 or a method may be employed which uses reflecting mirrors 19a, 19c disposed on the axis for the ion beam 6 to bend the optical path and a reflecting objectives 19b or the like is used to converge and apply light from a position just above the mask 20 normal thereto as shown in FIG. 3A.

A third embodiment of the present invention will now be described with reference to FIGS. 4A, 4B and 4C in which focused ion beam machining and implanting are combined with each other to correct the defect.

In a case where the defect 5 on the phase shifter 4 is very large and is very rough, setting of the applied ion quantity distribution D (x, y) according to the second embodiment cannot be easily performed. Accordingly, for the purpose of ion beam-assisted etching (IBAE), the focused ion beam 6a is applied to the defective portion 5 while supplying an etching gas 29 through a nozzle 28 to selectively etch the overall region of the defective portion 5 of the phase shifter 4 with respect to the lower layer 2. For example, in a case where the material of the phase shifter 4 is $SiO_2$ and the material of the transparent conductive layer 2 is $In_2O_3$, $XeF_2$ may be used as the etching gas. Then, the transparent conductive layer 2 is irradiated with the focused ion beam 6a to form the ion implanted layer 7 as shown in FIG. 4C, so that the phase difference correction is performed. Since the place to be corrected has been substantially flattened at this time and the applied ion quantity D can be uniform in a plane, setting thereof can easily be performed. In this embodiment thus arranged, the energy of the focused ion beam 6a must be changed from a low acceleration in the machining process to a high acceleration in the implanting process. In this case, in order to restrict the change in the diameter of the beam taken place due to the change in the ion acceralation energy, the convergent system is controlled. The aforesaid etching process may be applied to the transparent conductive layer 2 to perform the implanting to the transparent substrate 1 and correct the defect.

Figure 2B:
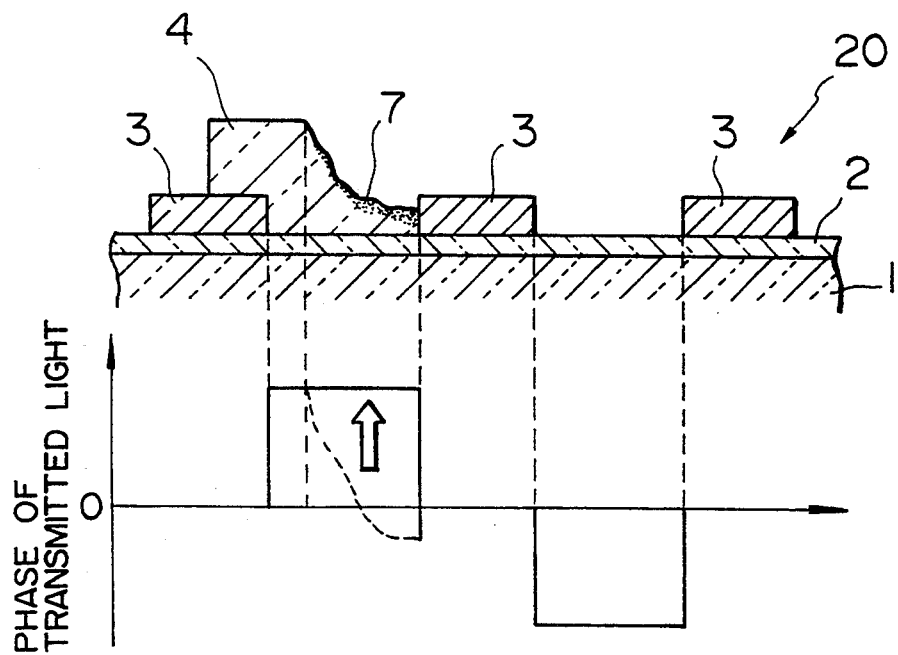
Figure 4A:
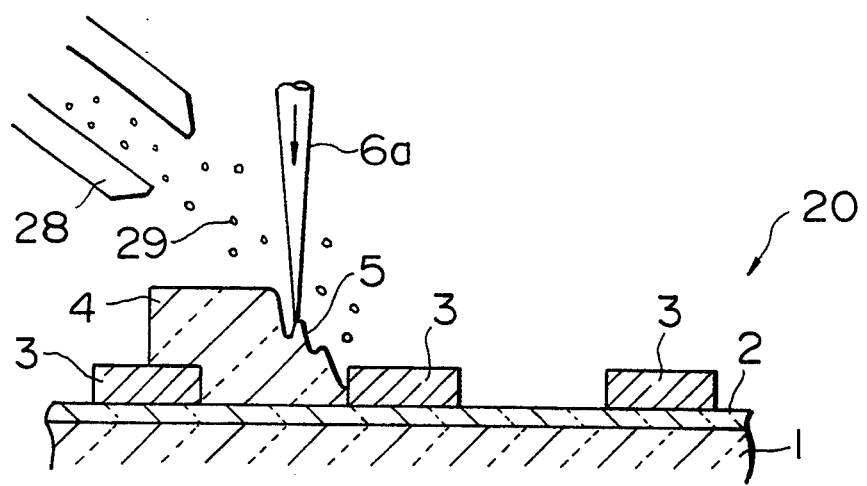
FIGS. 4A, 4B and 4C schematically illustrate a third embodiment of the correction method according to the one aspect of the present invention.
Figure 4B:
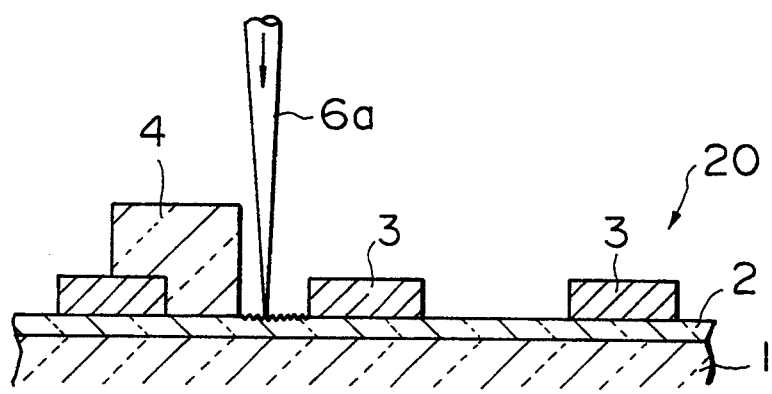
Figure 4C:
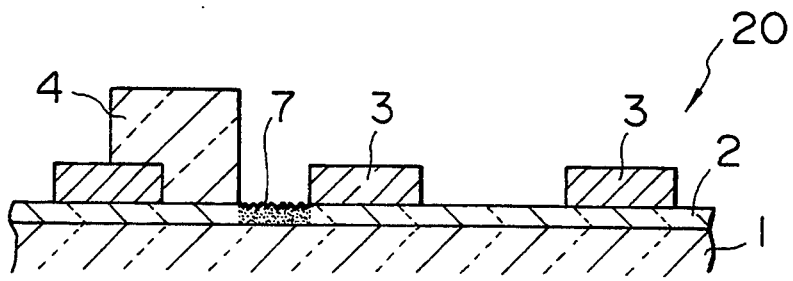
Figure 4D:
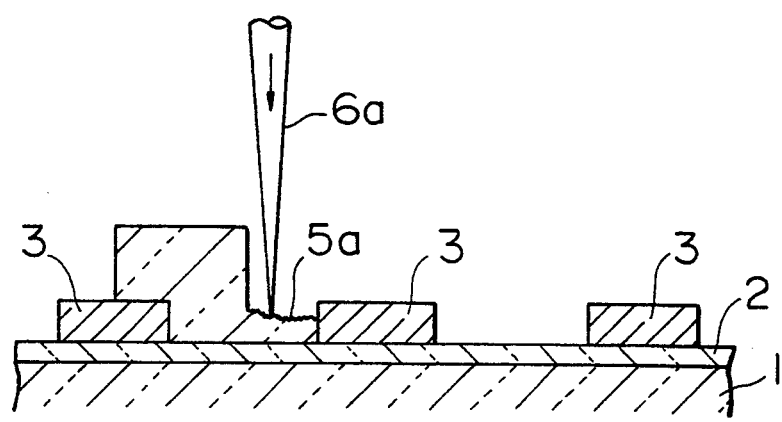
FIGS. 4D and 4E show modification of FIGS. 4B and 4C.
Figure 4E:
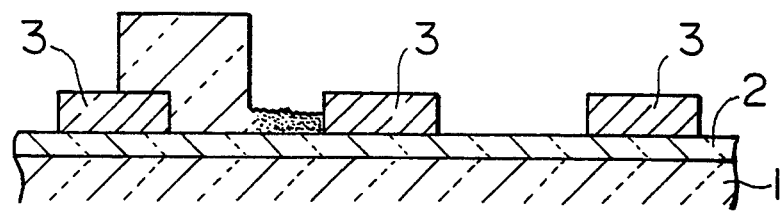

Since there is a tendency for protruded parts to be machined faster than recessed parts and for the bottom surface of the portion to be machine to be flattened in the machining operation shown in FIG. 4A, the machining operation may be stopped when the bottom surface 5a of the defect 5 has become sufficiently smoothed as shown in FIG. 4D, and consecutively the method similar to that shown in FIG. 2B is used as shown in FIG. 4E to perform the defect correction.

Figure 5:
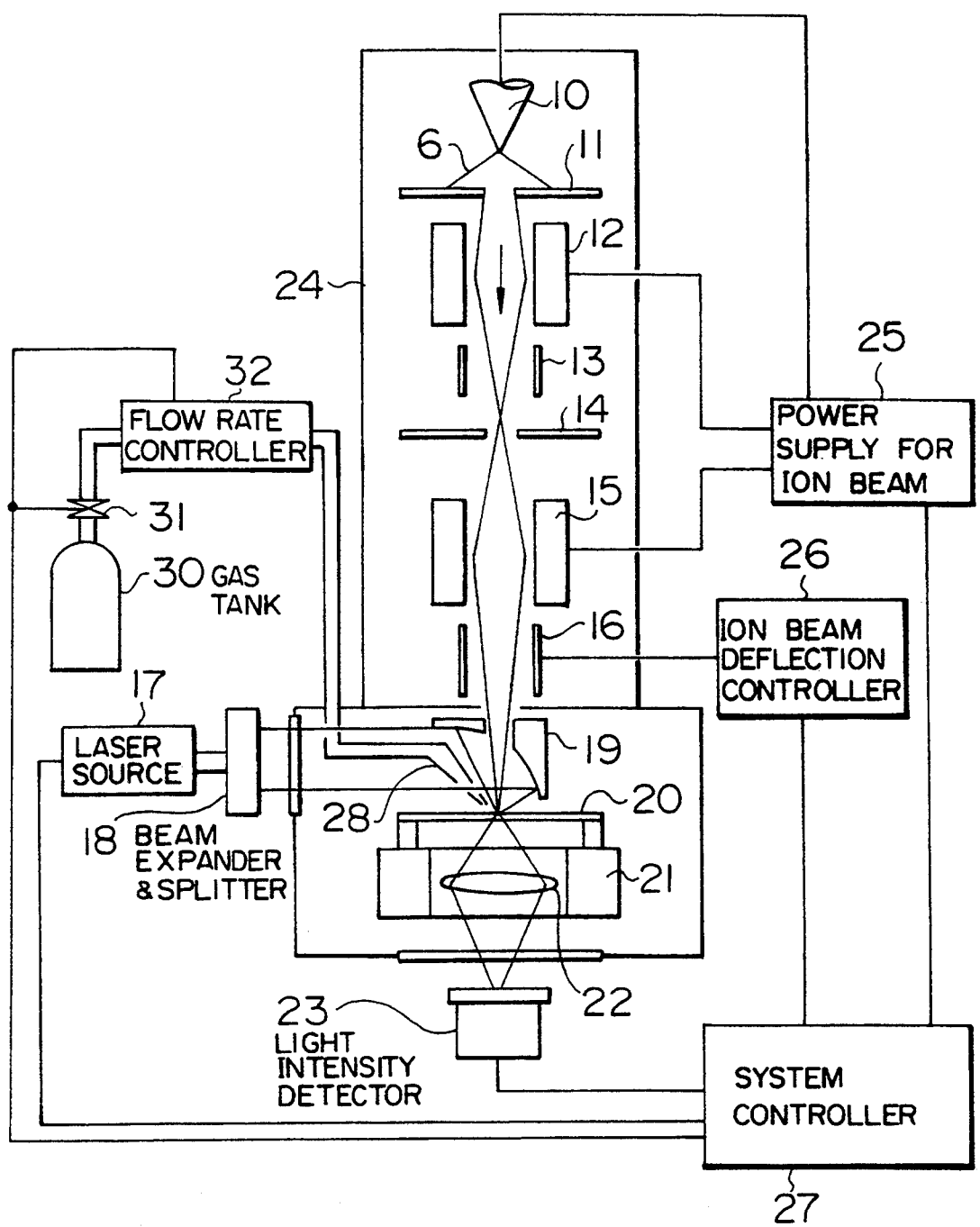
FIG. 5 simply illustrates an example of the correction apparatus for carrying out the correction method according to the third embodiment of the one aspect of the present invention.

FIG. 5 illustrates a structure of an apparatus for carrying out the embodiment shown in FIGS. 4A, 4B and 4C. The apparatus shown in FIG. 5 has, in addition to the apparatus shown in FIG. 3, a gas supply system comprising a gas tank 30, a valve 31, a flow rate controller 32 and a nozzle 28. With this, simultaneously with the application of the focused ion beam 6a thinned by the convergent system including the convergent lenses 12 and 15, supply of the etching gas is performed to locally etch the defective portion 5. The other arrangements and functions are the same as those of the apparatus shown in FIG. 3.

A fourth embodiment of the present invention will now be described with reference to FIGS. 6A and 6B, in which ion beam shower is collectively applied to a wide region of the mask 20 to correct a defect 5 in terms of the film thickness of the phase shifter 4.

Figure 6A:
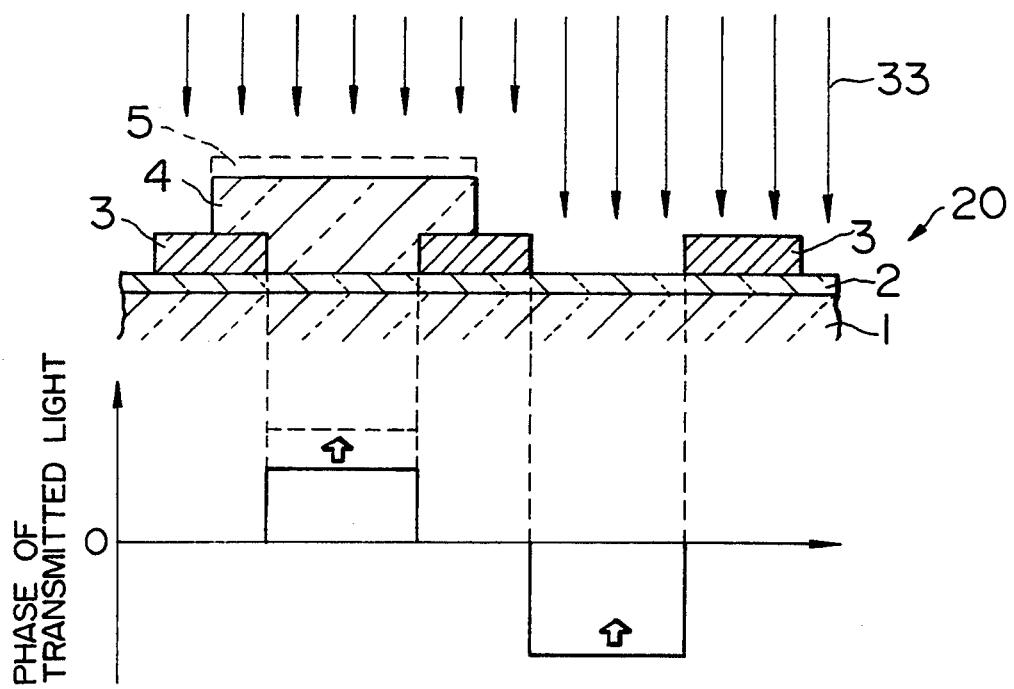
FIGS. 6A and 6B schematically illustrate a fourth embodiment of the correction method according to the one aspect of the present invention.

As shown in FIG. 6A, in a case where the film thickness of the phase shifter 4 is equally lacking, the phase of light transmitted therethrough deviates equally from that in a normal state (dashed line shown in FIG. 6A). For example, in a case where the phase is changed to $\pi/4$ due to the lacking of the film thickness from normal state $\pi/2$, the perfect cancellation with light transmitted (phase: $-\pi/2$) through the adjacent pattern cannot be made and deterioration in the resolution and the defective pattern width take place. Accordingly, a shower type ion beam 33 is collectively applied to form ion-implanted layers 7 in the overall region including the defective thickness portion as shown in FIG. 6B. In the ion implanted layer 7, the refraction index is increased and the amplitude of intensity of light, on a mask pattern imaging plane, which has passed through the phase shifter 4 is increased as designated by an outline arrow of FIG. 6A but the amplitude of intensity of the light, on the mask pattern imaging plane, which has passed through the adjacent pattern is reduced (the phase is deviated from $-\pi/2$).

Then, the intensity of light obtained by interference of the light which has passed through a portion in which the phase shifter 4 is present with the light which has passed through a portion in which the phase shifter 4 is not present are monitored by the detector 23 to stop the application of the ion beam 33 when the two transmitted light beams interfere destructively, and thus the correction is completed. In this case, the correction is completed at the moment when the phase of the light which has passed through the phase shifter 4 has been changed from $\pi/4$ to $3\pi/8$ and as well as the phase of the light which has passed through the adjacent pattern has been changed from $-\pi/2$ to $-3\pi/8$. If the adjacent transmitted light beams interfere destructively at the boundary, the pattern can be transferred with desired high resolution.

In a case where the thickness of the phase shifter 4 moderately varies in the mask 20, a structure may be employed in which, for example, the distribution of plasma in a bucket type ion source is controlled by a magnet and the current density distribution of the ion beam to be applied is set to cancel or compensate the aforesaid variation of the thickness to collectively correct the entire face of the mask 20. Furthermore, this embodiment may be similarly applied to the case where there is a defective film thickness of the transparent substrate 1 or the transparent conductive layer 2.

A fifth embodiment of the correction method according to the present invention will now be described with reference to FIGS. 7A and 7B, in which the defect of the phase shifter is corrected by the focused laser beam applied correctively. The method according to this embodiment is a method in which the focused ion beam according the embodiment shown in FIGS. 1A and 1B is replaced by a focused laser beam.

Figure 7A:
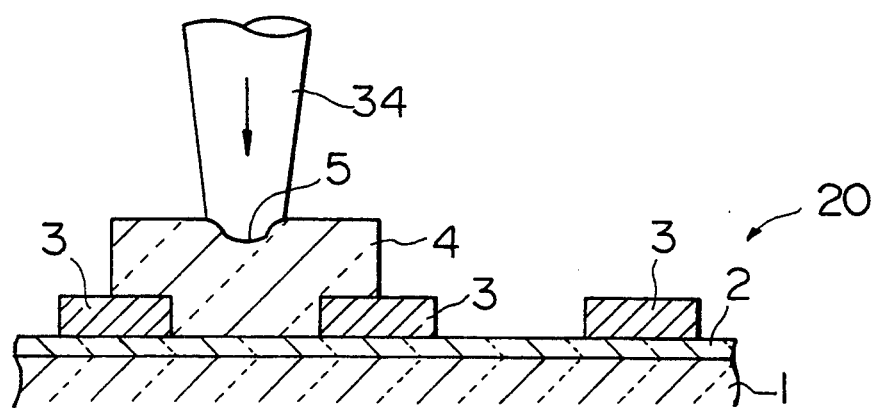
FIGS. 7A and 7B schematically illustrate a fifth embodiment of the correction method according to the one aspect of the present invention.
Figure 7B:
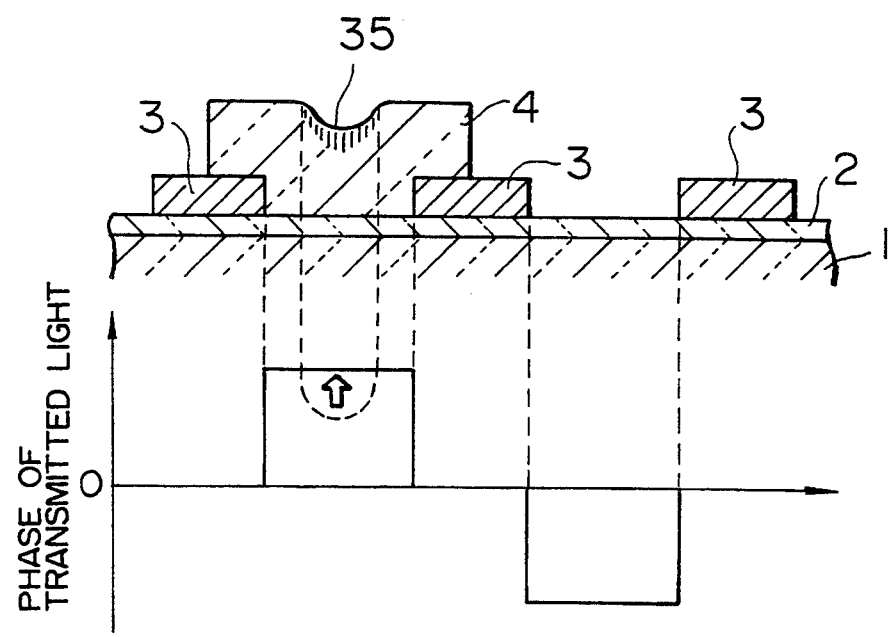

As shown in FIG. 7A, the horizontal cross sectional shape of a focused laser beam 34 is adjusted into the shape of the defect 5 so as to be collectively applied to the defective portion 5. Modifying the equation (3) expressing the conditions for correcting the phase difference by means of the laser beam applied, the following equation can be obtained:

$$d_0 = \left(\frac{n_e}{n} - 1\right) \cdot d_e. \tag{7}$$

Within the diameter of the focused laser beam 34, a thermal diffusion time is substantially constant and a depth $d_e$ of a thermal strain layer 35 is substantially constant. On the other hand, the power density of the laser beam 34 within the diameter of the beam 34 has substantially two-dimensional Gaussian distribution and the refraction index $n_e$ of the thermal strain layer 35 depending upon a degree of the thermal strain is enlarged in a direction toward the central portion of the beam. Therefore, only by correctively applying the focused laser beam 34 to the defect 5 similarly to the embodiment shown in FIGS. 1A and 1B, the phase difference of the defective portion 5 can be corrected as shown in FIG. 7B.

For adjusting horizontal cross sectional shape of the focused laser beam 34 into the shape of the defect 5, a method may be employed in which the image of the variable slit is converged and projected, or a method may be employed which utilizes a cylindrical lens is used.

A sixth embodiment of the defect correction method will now be described with reference to FIGS. 8A and 8B, in which collimated laser beam is applied to a defect of the phase shifter while performing a scanning of the beam and the defect is corrected. This method is arranged to use a focused laser beam in place of the focused ion beam used in the embodiment shown in FIGS. 2A and 2B.

Figure 8A:
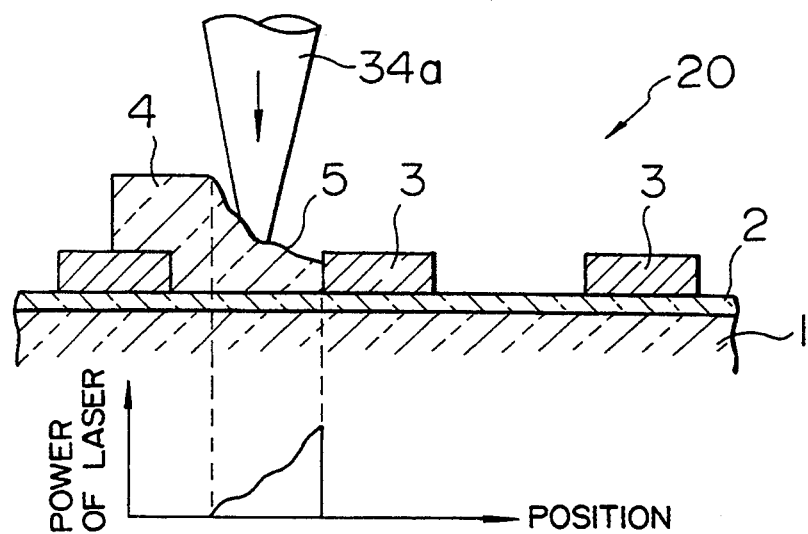
FIGS. 8A and 8B schematically illustrate a sixth embodiment of the correction method according to the one aspect of the present invention.
Figure 8B:
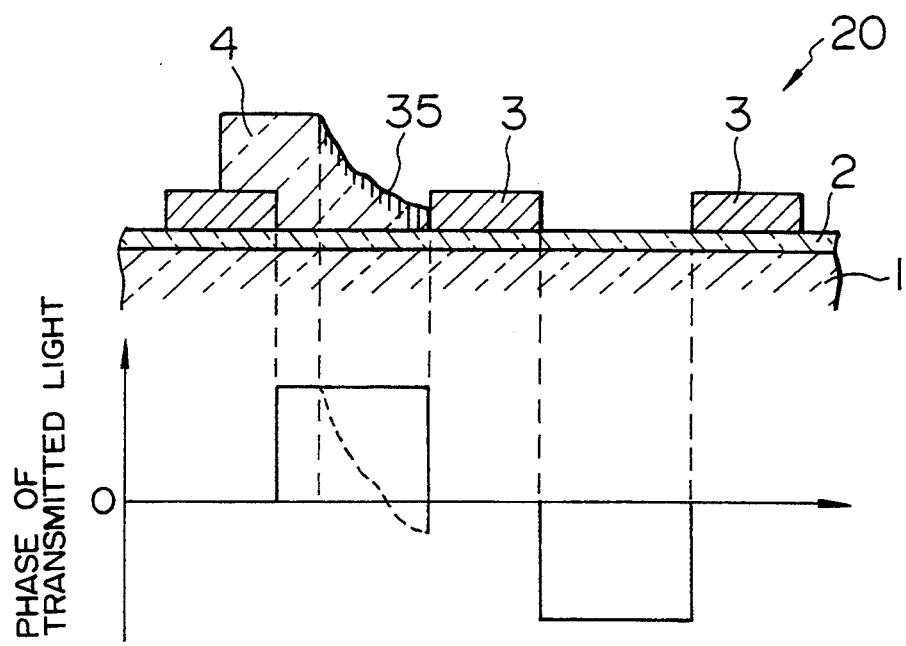

As shown in FIG. 8A, a laser beam which has been sufficiently collimated with respect to the size of the defect 5 is applied while performing the scanning thereof. Assuming, at this time, that the distribution of defect depths $d_0$, depth $d_e$ of the thermal strain layer 35 after the correction and the refraction index $n_e$ in a plane are respectively:

$$d_0(x, y), d_e(x, y) \text{ and } n_e(x, y),$$

the correction conditions can be expressed by the following equation from Equation (7):

$$d_0(x,y) = \left( \frac{n_e(x,y)}{n} - 1 \right) \cdot d_e(x,y) \qquad (6)$$

Letting the width of the laser pulse is constant, $d_e$ (x, y)=$d_e$, i.e. constant. Letting $n_e$=g (P) because $n_e$ depends upon the degree of the thermal strain, or the laser power P, the conditions for the distribution P (x, y), in the phase parallel with the principal face of the substrate 1, of the laser power P can be expressed by the following Equation (9) derived from Equation (8):

$$P(x,y) = g^{-1}\left( n \cdot \left( \frac{d_0(x,y)}{d_0} + 1 \right) \right) \qquad (9)$$

The relationship $n_e$=g (P) (monotonic increase) between $n_e$ and P can be previously obtained from an experiment for a standard sample. In a case where the defect 5 is corrected, the light interference method or the like is used to measure defect depth distribution $d_0$ (x, y), so that laser power distribution P (x, y) required to perform the correction is obtained by using Equation (9). In accordance with obtained P (x, y), the laser beam is applied to correct the phase difference in the defective portion 5 as shown in FIG. 8B. In this embodiment, P (x, y) can be set by using a transmissivity-variable filter disposed at an intermediate position in the laser optics system.

A structure of an apparatus for carrying out this embodiment is shown in FIG. 9. Referring to FIG. 9, reference numeral 36 represents a laser oscillator (laser source) for correction of defect, 37 represents a shutter, 38 represents a transmissivity-variable filter, 39 represents an XY scanner, 40 represents a convergent or focusing lens, and 41 represents a system controller for controlling the overall apparatus. Referring to FIG. 9, the same or similar elements as those of the elements according to the embodiment shown in FIG. 3 are given the same reference numerals.

The laser beam 34 emitted from the correction laser oscillator 36 phases through the transmissivity-variable filter 38 so that it is set to a distribution which corresponds to a predetermined laser power distribution P (x, y). Then, it is converged or focused by the convergent lens 40 so as to be applied to the surface of the phase shift mask 20 as a focused laser beam 34a. The XY scanner 39 (polygonal mirror or a galvano mirror or the like) disposed at an intermediate position can be used herein to apply the laser beam 34 to a desired position of the surface of the phase shift mask 20 or perform scanning as desired on the mask 20.

A system, in FIG. 9, for focusing the monitoring laser beam issued from the laser oscillator 17 onto the phase shift mask 20 and detecting transmitted lights interference by means of the detector 23 has the same structure and functions as those of the apparatus shown in FIG. 5 except for a fact that the parabola mirror 19 of FIG. 5 is replace by the convergent lens 40 in FIG. 9. By using this system, monitoring of the correction of the phase difference of the defect and measuring of the relationship $n_e$=g (P) between $n_e$ and P according to the embodiment of the present invention can be performed.

A seventh embodiment of the present invention will now be described with reference to FIGS. 10A, 10B and 10C, in which the defect is corrected by a combination of etching assisted by the focused laser beam with a heat application. The correction method according to this embodiment is a method arranged by replacing the focused ion beam by the focused laser beam in the embodiment shown in FIGS. 4A to 4C.

Figure 10A:
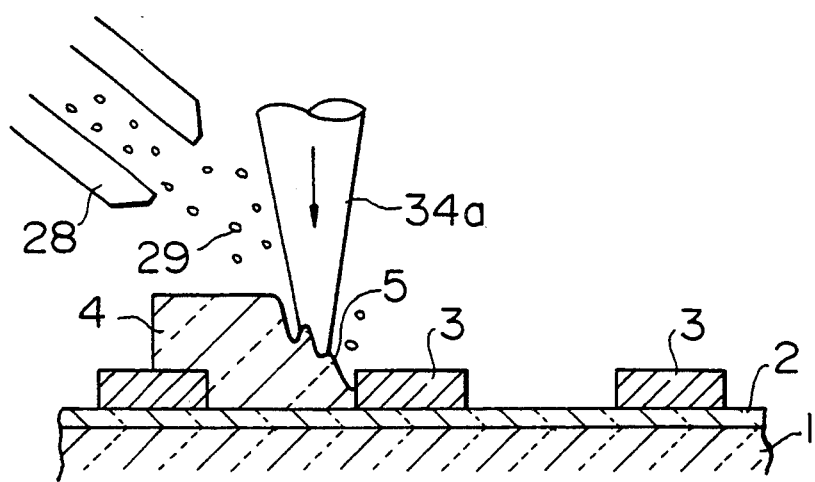
FIGS. 10A, 10B and 10C schematically illustrate a seventh embodiment of the correction method according to the one aspect of the present invention.

As shown in FIG. 10A, the focused laser beam 34a is applied while supplying the etching gas 29 through the nozzle 28 so as to selectively etch the phase shifter 4 in the defective portion 5 with respect to the lower layer. Then, the focused laser beam 34 is applied to the transparent conductive layer 2 to form the thermal strain layer 35, so that the phase difference is corrected. In this embodiment, the focused laser beam 34a should be changed from a low power in the etching process to a high power in the process in which the thermal strain is formed.

Figure 10B:
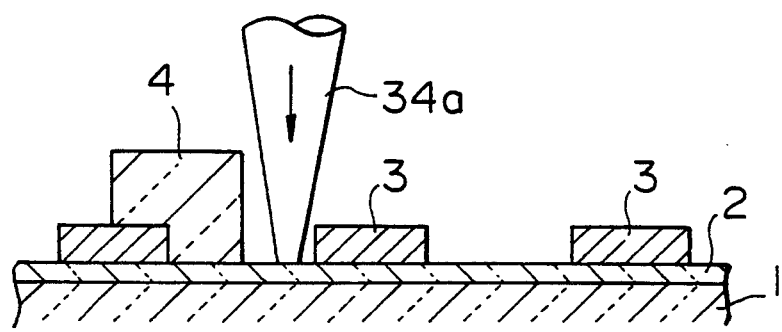
Figure 10C:
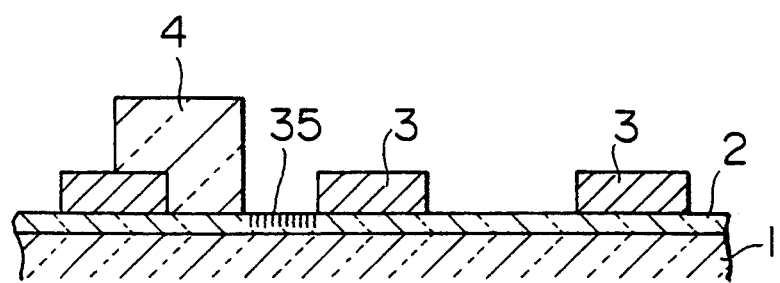
Figure 11:
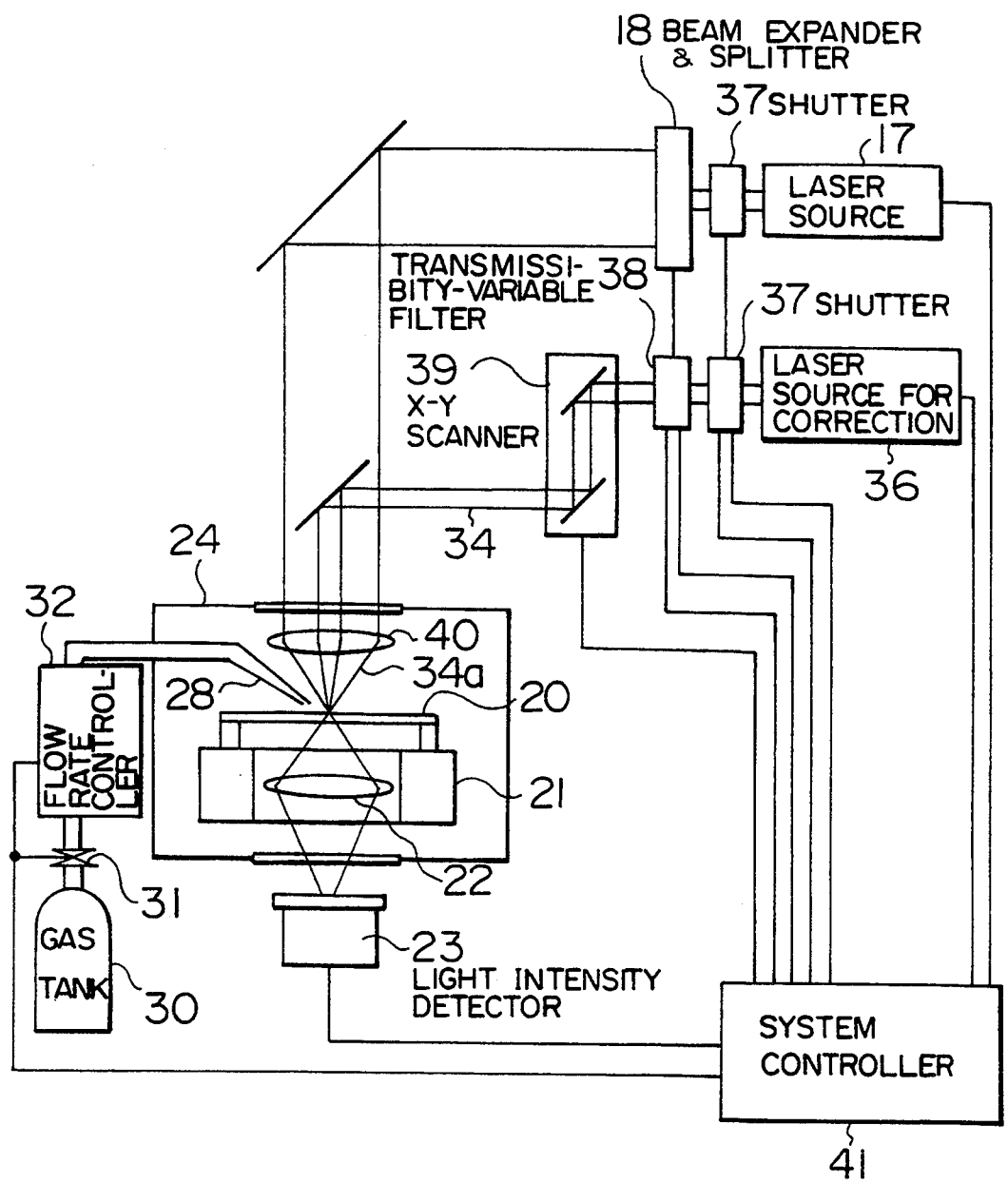
FIG. 11 simply illustrates an example of the correction apparatus for carrying out the correction method according to the seventh embodiment of the one aspect of the present invention.

The structure of an apparatus for carrying out the embodiment shown in FIGS. 10A to 10C is shown in FIG. 11. The apparatus shown in FIG. 11 has, in addition to the apparatus shown in FIG. 9, the gas supply system comprising the gas tank 30, the valve 31, the flow rate controller 32 and the nozzle 28. Furthermore, an exhaust system (omitted from illustration) is used to exhaust the etching gas from a chamber 24 where the phase shift mask 20 is disposed. The etching gas is supplied to the surface of the phase shift mask 20 simultaneously with the application of the focused laser beam 34a, so that the defective portion 5 is locally etched. The other arrangement and function are the same as those of the apparatus shown in FIG. 9.

An eighth embodiment of the present invention will now be described with reference to FIGS. 12A and 12B, in which wide beam laser or light from a heated element such as a lamp is collectively applied to a wide region of the mask to correct the defective thickness of the phase shifter. The method according to this embodiment is a method in which the laser beam or light from heated element is used in place of the ion beam employed in the embodiment shown in FIGS. 6A and 6B.

Figure 6B:
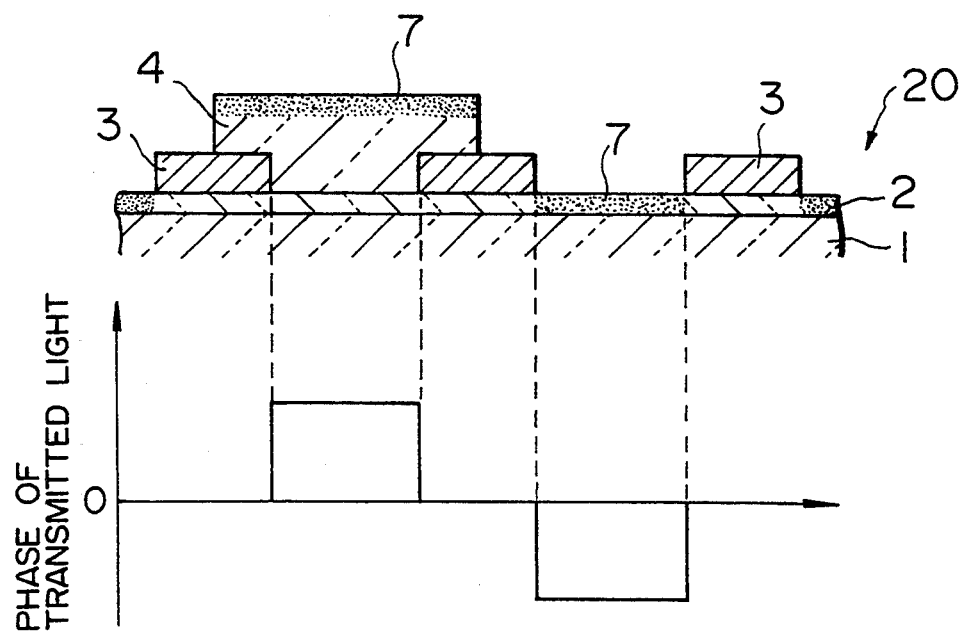
Figure 12A:
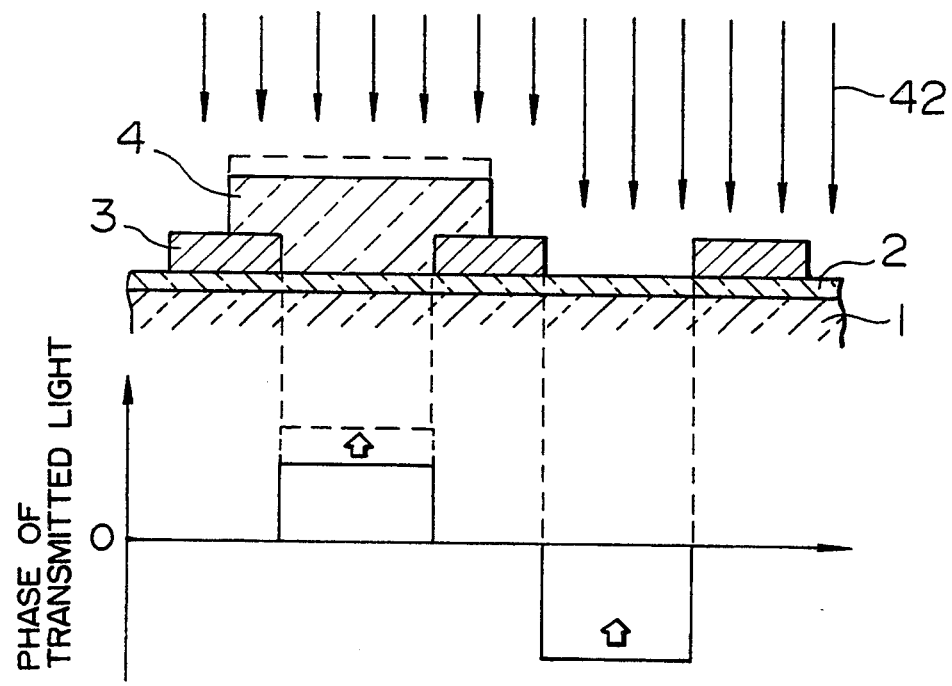
FIGS. 12A and 12B schematically illustrate an eighth embodiment of the correction method according to the one aspect of the present invention.
Figure 12B:
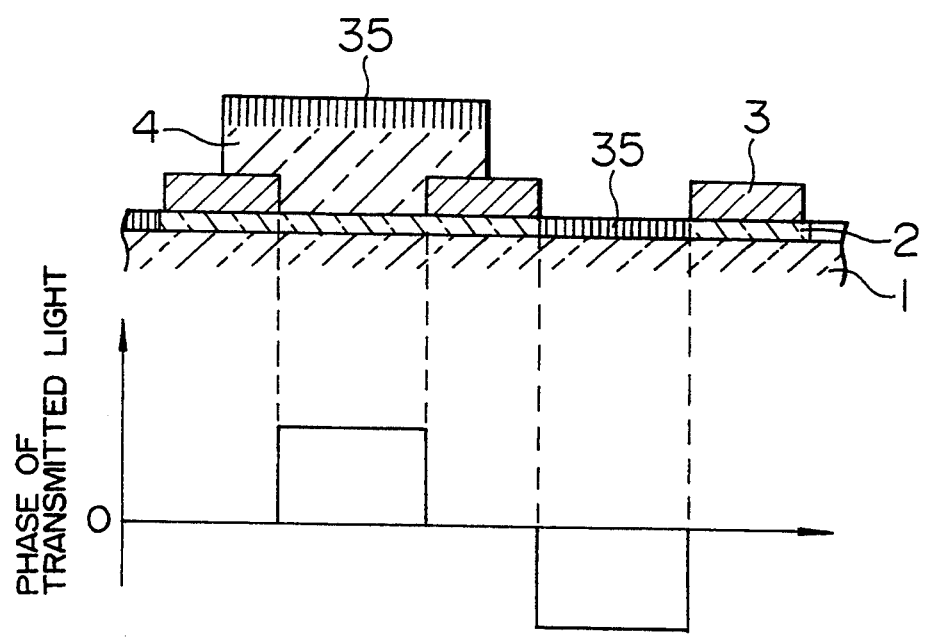

That is, as compared with the embodiment shown in FIGS. 6A and 6B in which the shower type ion beam is applied to form a uniform ion-implanted layer and the refraction index is increased, this embodiment uses the wide beam laser 42 as shown in FIG. 12A to form the uniform thermal strain layer 35 as shown in FIG. 12B and the refraction index is increased. The principle of correcting the defective thickness of the phase shifter 4 by uniformly increasing the refraction index thereof is the same as that according to the embodiment shown in FIGS. 6A and 6B.

Although the laser beam or the light beam from the heated element was used for forming the heat strain layer in the fifth embodiment to the eighth embodiment, the electron beam may be used to carry out the present invention.

As described above, according to the one aspect of present invention, the refraction index of a desired portion on the phase shift mask can be accurately adjusted and the defect in the phase shifter can be accurately and easily corrected. Therefore, a satisfactory advantage can be obtained in a semiconductor device manufacturing field which uses the phase shift masks.

Then, a method according to another aspect (the first aspect) of the present invention will now be described, in which a part of a phase shift mask having a phase shifter with a defective portion is removed and the undesired phase difference generated due to the defective portion is reduced to correct or repair the mask.

Figure 13A:
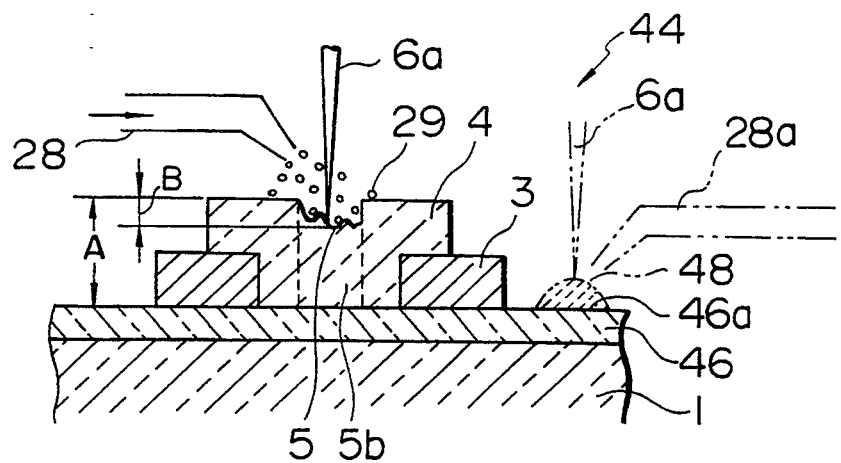
FIGS. 13A, 13B and 13C illustrate a first embodiment of a method of correcting a phase shift mask according to another aspect (first aspect) of the present invention.
Figure 13B:
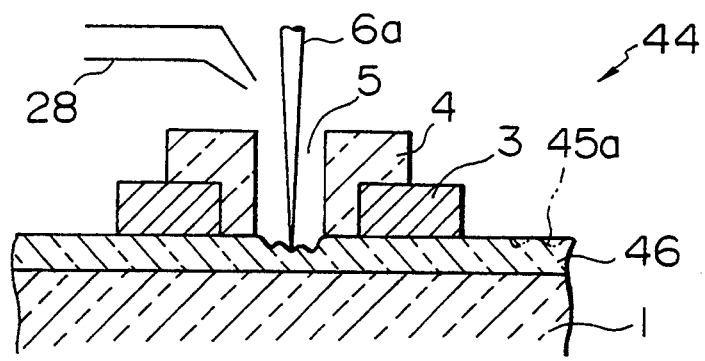
Figure 13C:
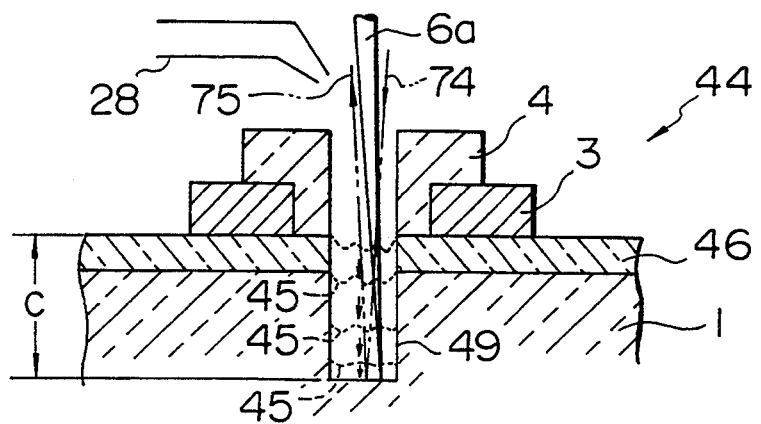
Figure 14:
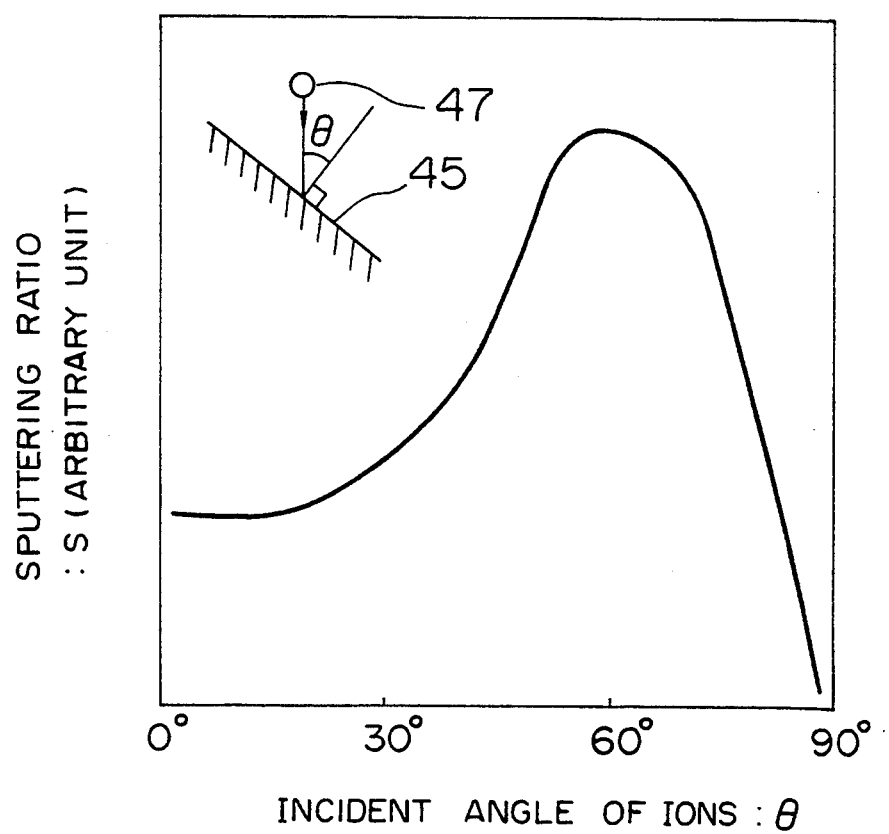
FIG. 14 is a graph which illustrates a relationship between incident angles of ions and sputtering ratios.
Figure 15A:
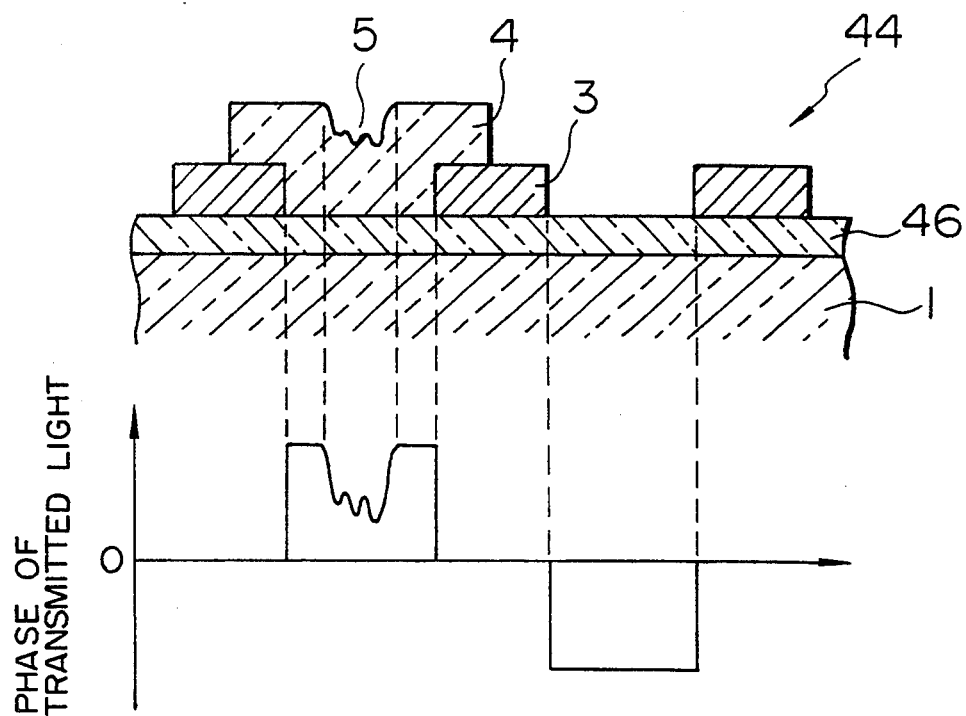
FIGS. 15A and 15B illustrate the principle of the correction of the phase shift mask shown in FIGS. 13A to C.
Figure 15B:
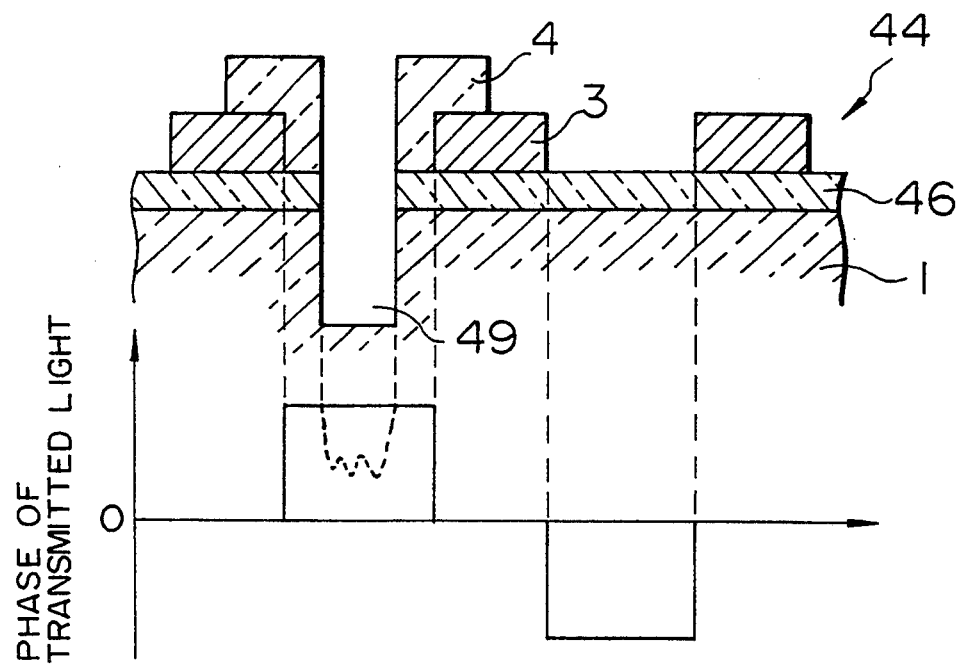

FIGS. 13A to 13C, FIG. 14, and FIGS. 15A and 15B illustrate a first embodiment of another aspect of the present invention. FIGS. 13A to 13C illustrate a method of correcting the phase shift mask according to this embodiment, FIG. 14 is a graph which illustrates the relationship between an incident angle of ion and a sputtering ratio and FIGS. 15A and 15B illustrate the principle of correcting the phase shift mask according to this embodiment.

Referring to FIG. 13A, a phase shift mask 44 comprises a transparent glass substrate 1, a transparent etching stopper layer 46, a light shielding pattern 3 made of a Cr film and a spin-on glass (SOG) layer 4 serving as a transparent phase shifter. Reference numeral 5 represents a defective portion of the phase shifter 4, 6a represents a focused ion beam, 28 represents a gas nozzle and 29 represents an etching gas. The thickness of the etching stopper layer 46 is about 10 nm so as to avoid affecting the phase inversion of the exposure light by the phase shifter 4. The etching stopper layer 46 is made of a material showing a large difference in the etching speed from that of the phase shifter 4 in order to serve as a stopper at the time of removing the phase shifter 4 by ion beam-assisted etching. Furthermore, the material of the etching stopper layer 46 should have a sufficient transmissivity to exposure light. For example, it is exemplified by a metal oxide such as $Al_2O_3$ and $Ta_2O_5$ or a metal halide such a $MgF_2$ and $CeF_3$.

In a case where there is a defect 5 in the phase shifter 4 as shown in FIG. 13A, the etching gas 29 is sprayed on the defective portion 5 from the gas nozzle 28 while applying the focused ion beam 6a to the defective portion 5, so that the phase shifter 4 at the defective portion 5 is selectively etched with respect to the etching stopper layer 46 disposed under the phase shifter 4 by focused ion beam-assisted etching (FIBAE). The detection of the defect 5 is performed by the aforesaid method. In a case where the phase shifter 4 is made of SOG or $SiO_2$ and the etching stopper layer 46 is made of a metal oxide such as $Al_2O_3$ and $Ta_2O_5$ or metal halide such as $MgF_2$ and $CeF_3$, the etching gas 29 may be a fluorine type gas such as $XeF_2$. When etching of the phase shifter 4 proceeds to a moment at which a portion 5b of the phase shifter 4 which corresponds to or is situated under the defective portion 5 is removed to expose the etching stopper layer 46, the supply of the etching gas 29 is stopped. In this case, the etching selection ratio of the phase shifter 4 to the etching stopper layer 46 is about 50 and thereby the etching stopper layer 46 is left when etching of a part of the defective portion 5 of the phase shifter 4 having the largest thickness has been completed.

However, the etching stopper layer 46, to be exact, has a shape of a bottom surface 45 which is similar, although much less roughened, to the shape of the defective portion 5. This problem can be overcome when the machined bottom surface 45 is smoothed with a processing of machining or perforating the glass substrate 1 as shown in FIG. 13C. The reason for this lies, as shown in FIG. 14, that the sputter ratio S is different depending upon the incident angle of ions 47. More specifically, the sputtering speed is raised in a slanting portion of the machined bottom surface 45, that is a portion at which the incident angle $\theta$ of the ions is large and thereby the considerably rough bottom surface 45 can be smoothed with the proceeding of the machining. As described above, the glass substrate 1 is perforated by a depth C which is the same as a magnitude of optical path in a normal portion of the phase shifter 4 in which there is no defect. The depth of etching can be controlled with the quantity of dose for the ion beam which can be previously obtained from an experiment or the like.

The aforesaid method is used to correct the lacking type defect 5 which is partially missing the phase shifter 4.

On the other hand, in a case where a residual type defect 48 (designated by a phantom line shown in FIG. 13A) in which the material of the phase shifter 4 is undesirably deposited on a portion 46a is present, the ion beam 6a is applied while spraying the etching gas 29 from the nozzle 28a to the residual type defect 48 as designated by the phantom line, so that the material which forms the residual type defect 48 is removed. Also in this case, the presence of the etching stopper layer 46 causes a substantially flat and smooth bottom surface 45a (designated by the phantom line in FIG. 13B) to be formed after the removal.

Then, descriptions will be made about a method and an apparatus for use to detect or monitor the depth of machining or perforation or milling while the corrected portion 49 is formed by machining the glass substrate 1 in the step shown in FIG. 13C.

Figure 18A:
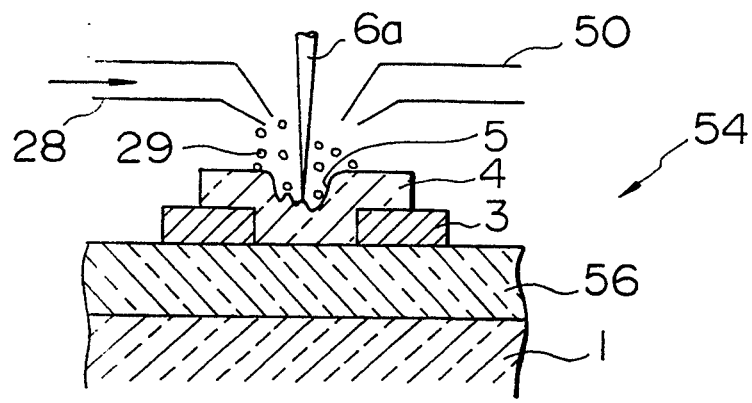
FIGS. 18A to 18C illustrate the method of correcting the phase shift mask shown in FIGS. 17A and 17B.
Figure 18B:
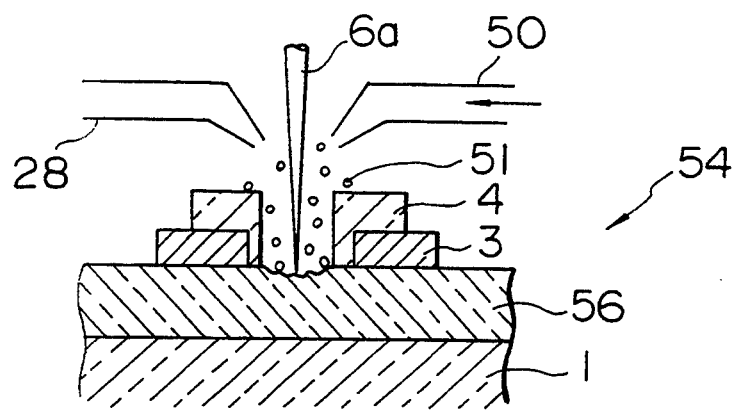
Figure 22:
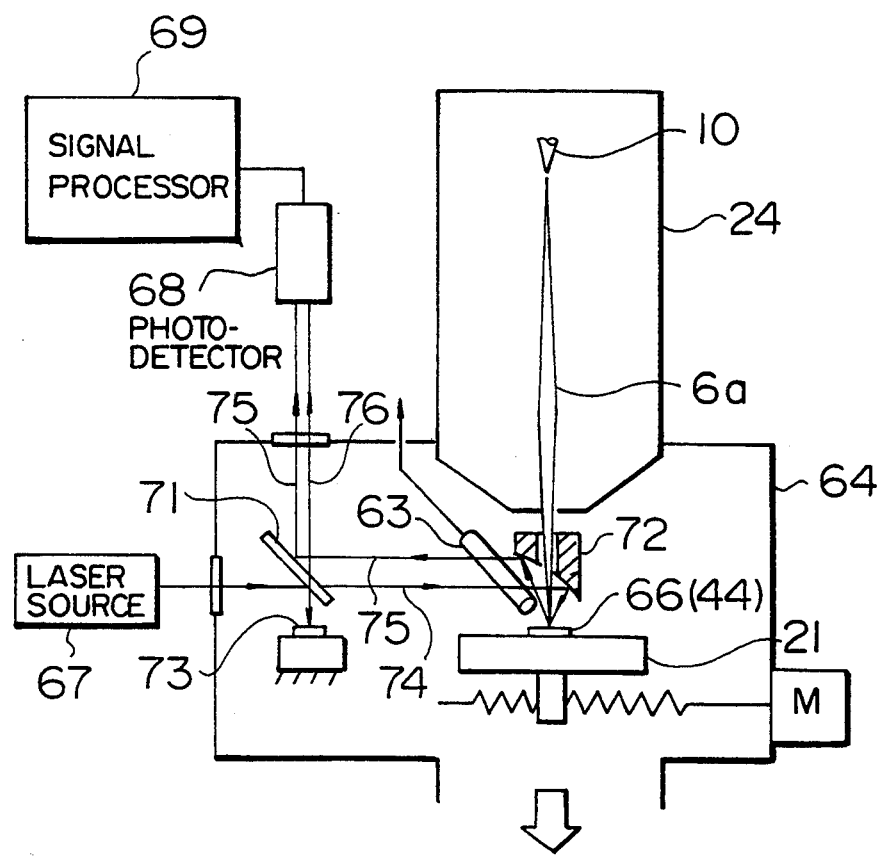
FIG. 22 illustrates the principle of the method and apparatus for monitoring the depth of a machined hole for correcting the phase shift mask.
Figure 23:
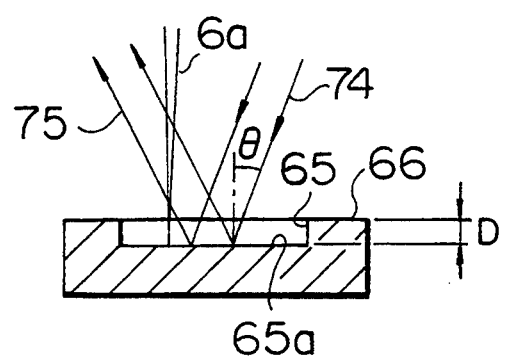
FIG. 23 is a graph which illustrates the relationship between a machined hole and a laser beam.

FIGS. 22 and 23 illustrate the principle of the apparatus and method of monitoring the machining depth. FIG. 22 illustrates an focused ion beam machining apparatus having a machining depth monitoring means. An ion beam column or a chamber 24 includes, similarly to the structure shown in FIG. 3, an optical system composed of the ion source 10, the convergent lens, a blanker and the deflection system and the like which are the elements possessed by an ordinary focused ion beam machining apparatus. Furthermore, a detector 63 for detecting secondary particles is disposed under the ion beam column or the chamber 24. A vacuum chamber 64 includes an XY stage 21 formed similarly to that of the apparatus shown in FIG. 3 and has, on the surface thereof, the phase shift mask 44 which is a workpiece 66 to be machined. The optical system causes the focused ion beam 6a to deflectively applied to the workpiece 66 (44) to sputter a part of the workpiece 66 (44). When the workpiece is made of insulating material, an electron shower (omitted from illustration) for preventing the charge up of the workpiece 66 (44) is provided. In a case where the phase shift mask 44 or 54 serving as the workpiece 66 is subjected to the focused ion beam-assisted etching as shown in FIG. 13A or FIG. 18B or the like to be described later, an etching gas supply nozzle 28 or 50 and the like (omitted from illustration) are provided. In a case where a focused ion beam-assisted CVD is performed, components (omitted from illustration) for supplying a CVD gas is provided.

In a portion outside the chamber 64, a laser source 67, a photodetector 68 and a signal processor 69 are disposed. The laser source 67 such as eximer laser device emits a laser beam having a wavelength which is shorter than that of the laser beam emitted from the exposure laser source 17 (see FIG. 17 or the like).

The chamber 64 includes a half-mirror 71, a mirror 72 and a stationary reflecting mirror 73. The mirror 72 may be used as the mirror 19 shown in FIG. 3 or the like. The optical system thus arranged is assembled so as to cause the laser beam 74 to be applied to the surface of the workpiece 66 to be machined by the focused ion beam 6a. As shown in FIG. 23 which illustrates the principle, the laser beam 74 is ordinarily converged into a sufficiently small area of the workpiece 66 as compared with the region 65 (which corresponds to the corrected hole 49 shown in FIG. 13C) to be machined by the focused ion beam 6a and is reflected by only the surface 65a (which corresponds to the bottom surface 45 shown in FIG. 13C) to be machined.

Light emitted from the laser source 67 passes through the half-mirror 71 and is reflected by the reflecting mirror 72 so as to be applied, to the surface 65a (45) of the workpiece 66 (44) to be machined, at an incident angle $\theta$. Light 75 reflected by the surface 65a (45) of the workpiece 66 (44) to be machined is reflected by the mirror 72. Then, it is reflected by the half-mirror 71 and is made incident upon the photodetector 68. On the other hand, light emitted from the laser source 67 and reflected downwards by the half-mirror 71 is reflected by the stationary reflecting mirror 73 so as to be made incident upon the photodetector 68 as reference light 76. At the photodetector 68, reflected light 75 and reference light 76 interfere with each other so that bright and dark portions are generated corresponding to the change in the optical path for reflected light 75 with proceeding of machining. This change is detected by the signal processor 69 so that depth D of machining shown in FIG. 23 is obtained. In a case where the depth of machining is D, the length of the optical path is elongated by $2D/\cos\theta$ as compared with a case where $D=0$. A fact may be utilized that, letting the wavelength of the laser beam 74 be $\lambda_M$ and an arbitrary integer be m, the bright portion and the dark portion are changed at each D which meets $m\lambda_M = 2D/\cos\theta$, if the depth D is large.

The method of monitoring machining is applied as follows in a case where the method of correcting the phase shift mask 44 shown in FIGS. 13A to C is performed. Assumptions are made that the thickness of the phase shifter or the phase shift pattern 4 made of $SiO_2$ is A and the depth of the lacking type defect 5 is B (in a case where the residual type defect 48, a height thereof is B). Since the layer 4 the thickness of which is A has a function of shifting the phase by $\pi$, A is usually hundreds of nm. In order to make the error in the phase shift to be 10% or less, depth (or thickness) B must be 10% or less of A, that is several tens of nm. Therefore, although the machining depth C to the bottom 45 of the hole in the corrected portion 49 is hundreds of nm, the required accuracy of the depth of machining is ± several tens of nm. Since the aforesaid accuracy cannot be realized by the conventional machining time control and the end point of machining cannot be discriminated depending upon the difference in the material, it is preferable that the light interference method be employed. In a case the required accuracy in the depth of the hole is relatively small as compared with the wavelength of light, the rate of change in the detected quantity of light, and relationship between the machining time and the machined depth can be utilized for determining the depth from the machining time.

Figure 24:
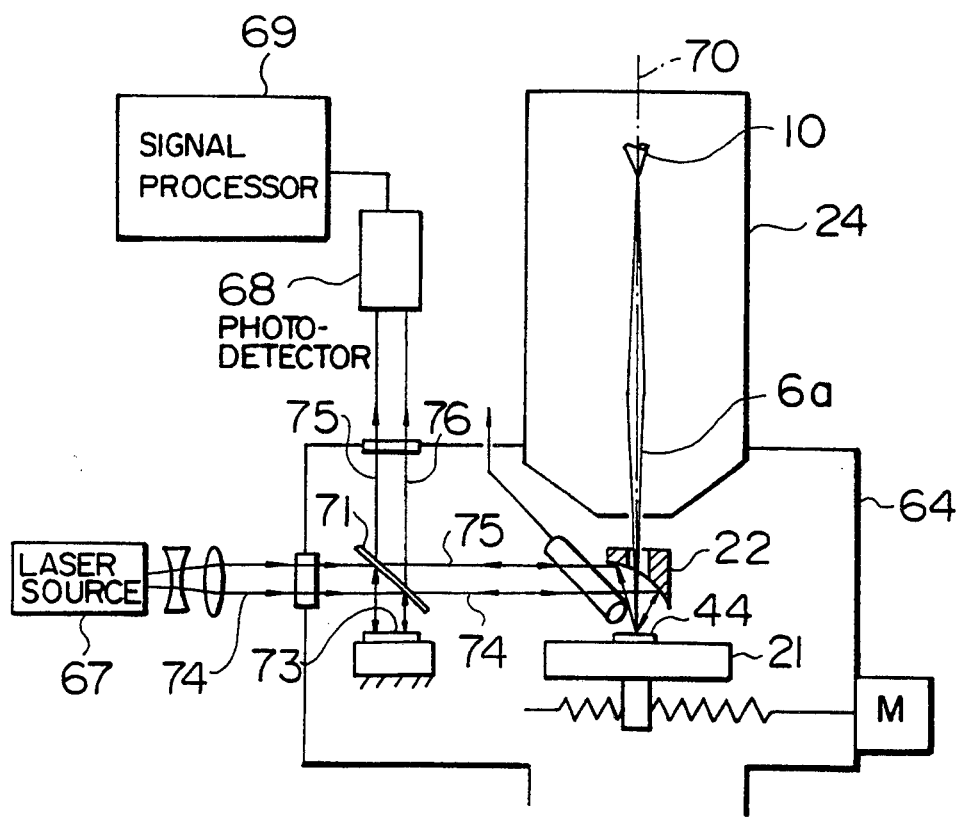
FIG. 24 illustrates a phase shift mask correction apparatus according to an embodiment of the present invention.
Figure 25A:
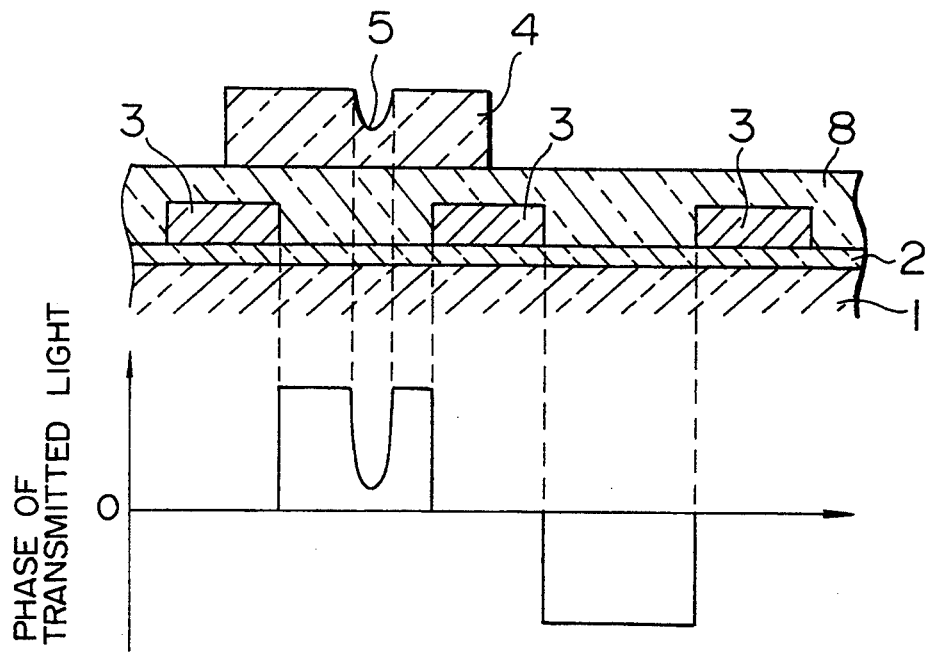
FIGS. 25A and 25B illustrate a conventional phase shift mask.
Figure 25B:
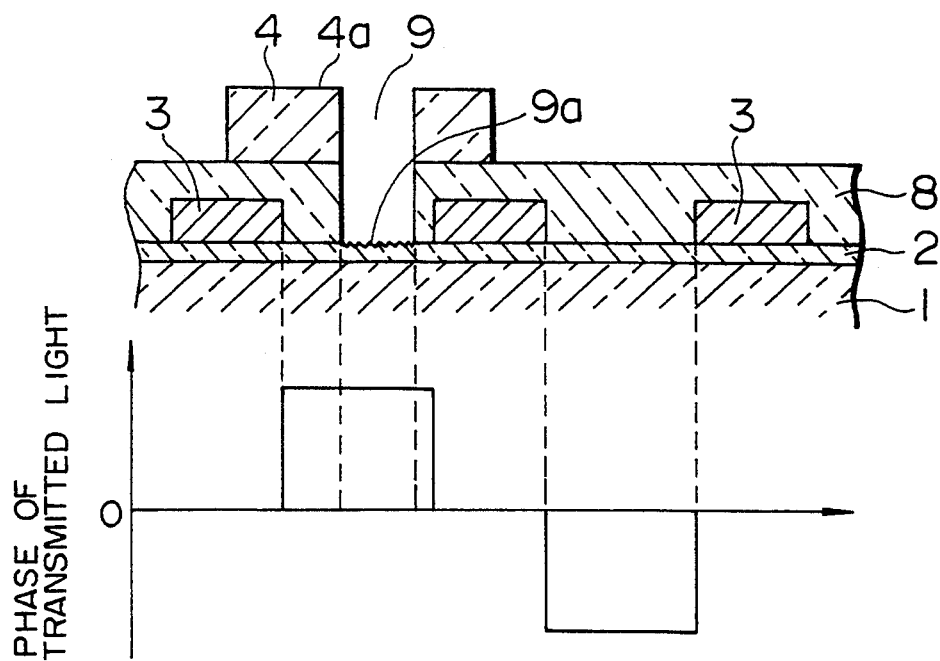

This method is shown in FIG. 24. In the case where the mask 44 is corrected, incident light beam should be focused since the machining area is on the order of $\mu$m square. Referring to FIG. 24, the parabolic mirror 22 is disposed coaxially with the axis 70 of an ion beam. The light beam emitted from the laser source 67 is focused onto the bottom surface 45 of the corrected hole 49 of the phase shift mask 44 as the workpiece by the parabolic mirror 22 and is reflected by the bottom surface 45 which is the surface to be machined by the focused ion beam (as designated by the phantom lines 74 and 75 shown in FIG. 13C). Then, it is combined with reference light 76 by the half mirror 71 and is made incident upon the photodetector 68. Then, the same operation as that described about the principle with reference to FIG. 22 is performed.

If desired, the aforesaid method, per se, of detecting the quantity of machining can be applied to monitoring of the progress of deposition of a film such as the $SiO_2$ film by the focused ion beam-assisted CVD (where, for example, a CVD gas such as a mixture gas of $SiH_4$ and $N_2O$, and an organic silane gas like a TEOS is used).

With the aforesaid monitoring method and the monitoring apparatus, a satisfactory accuracy in the depth can be obtained by the light interference method when workpiece made of the same material are machined by the focused ion beam machining and the phase shift mask can be accurately corrected.

Referring back to FIGS. 15A and 15B, the phase of exposure light having excessively deviated in the defective portion 5 before the correction as shown in FIG. 15A shows the same phase difference as the normal portion of the phase shifter 4 as designated by a solid linear line shown in FIG. 15B after the correction has been performed by the method according to this embodiment. The reason for this lies in that the difference between an optical path through the portion in which material of the phase shifter 4 is completely present and an optical path through the corrected portion 49 exactly corresponds to the phase difference of $2\pi$ and thereby an equivalent or effective state in which the phase shifter is present is realized.

A second embodiment of the correction method according to said another aspect of the present invention will now be described with reference to FIGS. 16A to 16D in which a gas for selectively etching an etching stopper layer with respect to the glass substrate.

Figure 16A:
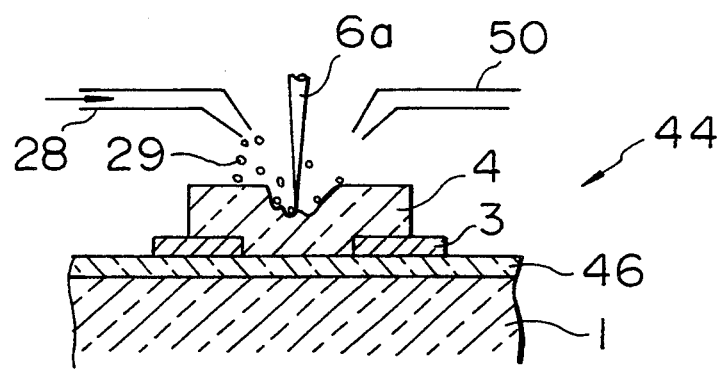
FIGS. 16A to 16D illustrate a second embodiment of the method of correcting the phase shift mask according to said another aspect of the present invention.
Figure 16B:
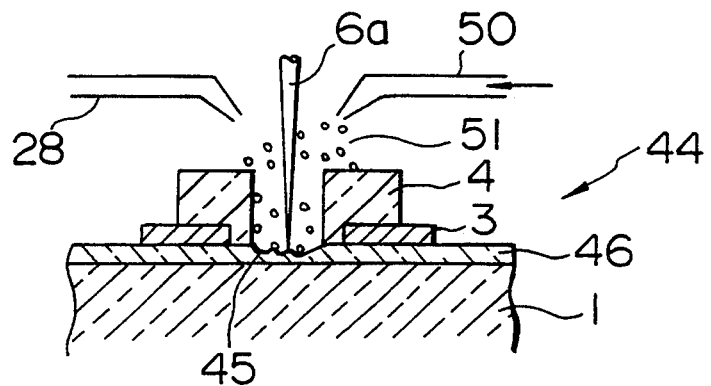
Figure 16C:
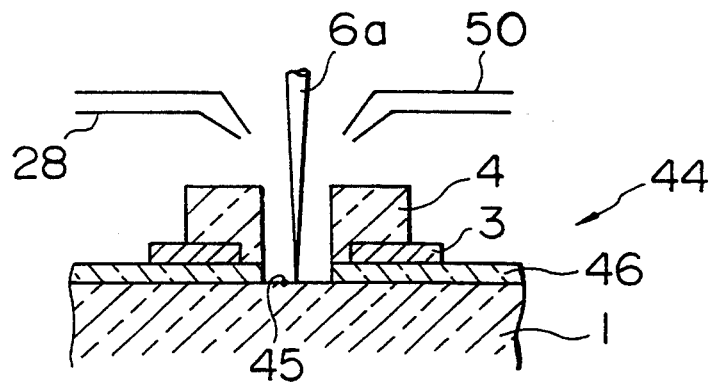
Figure 16D:
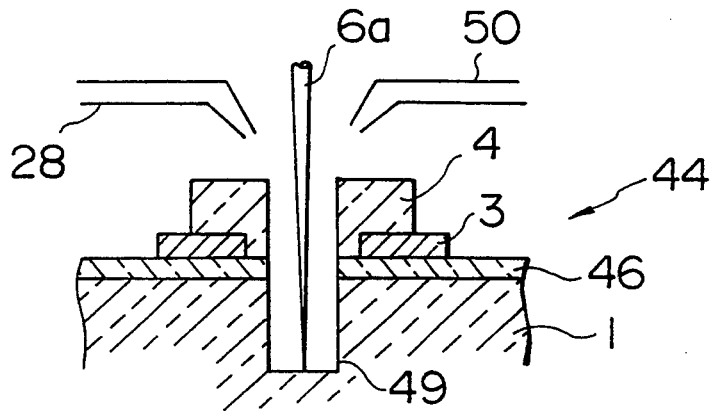

Referring to FIG. 16A, reference numeral 28 represents a gas nozzle for supplying the etching gas 29 for selectively etching the phase shifter 4 relative to the etching stopper layer 46. First, the defect 5 of the phase shifter 4 is removed similarly to the method according to the embodiment shown in FIG. 13A. If a residual type defect caused by excess deposition of the material of the phase shifter 4 is present on the surface of the stopper layer 46, the residual type defect can be removed similarly to the method according to the embodiment shown in FIGS. 13A to 13B. Then, the supply of the etching gas 29 to the phase shifter 4 is stopped as shown in FIG. 16B. Then, a gas 51 for selectively etching the etching stopper layer 46 with respect to the glass substrate 1 positioned under the etching stopper layer 46 is supplied through the gas nozzle 50. As the etching gas 51, for example, a Cl type gas such as $Cl_2$ and $SiCl_4$ may be employed. By etching the etching stopper layer 46 as described above, the bottom 45 of the machined portion can further be smoothed as shown in FIGS. 16B and 16C. After machining of the etching stopper layer 46 has been stopped, the supply of the etching gas 51 is stopped and the glass substrate 1 is, similarly to the embodiment shown in FIG. 13C, perforated by a depth corresponding to the magnitude of the optical path defined by the thickness of the phase shifter 4, if the thickness of the stopper layer 46 is negligibly small, so that the correction is preformed.

Although the glass substrate 1 is machined by sputtering to strike or hit the atoms of the glass substrate 1 by the ion beam 6a to discharge, etching may be performed while supplying a fluorine type gas to the region to be machined through a nozzle (omitted from illustration) formed similarly to the nozzles 28 and 50. With this method, the machining speed can be raised because the etching gas is used and damage of the glass substrate 1 by the ion beam 6a can be reduced because a reactive process is performed. As a matter of course, acceleration energy of the ion beam can be changed as desired depending on the difference between the sputtering and the IBAE.

Figure 20:
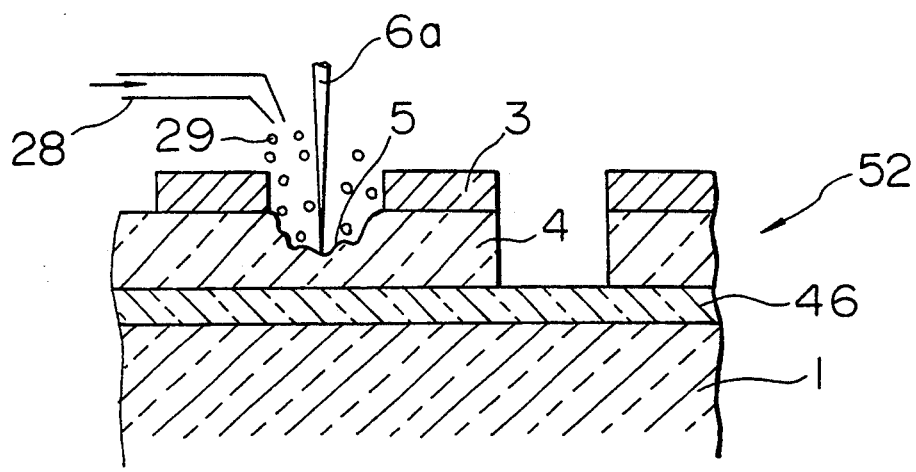
FIG. 20 illustrate a modified structure of the phase shift mask according to the first and the second embodiments of said another aspect of the present invention.
Figure 21:
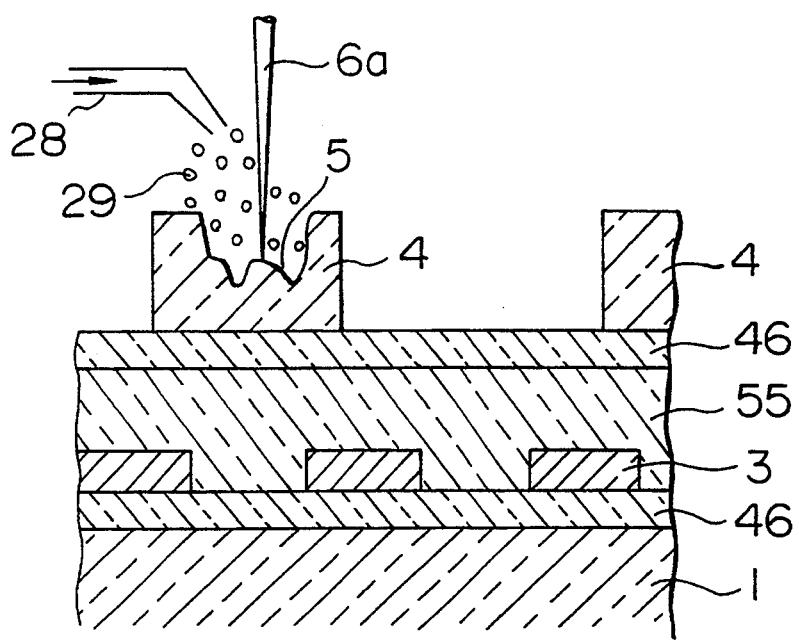
FIG. 21 illustrate another modified structure of the phase shift mask according to the first and the second embodiments of said another aspect of the present invention.

In the embodiments shown in FIGS. 13A to 13C and FIGS. 16A to 16D, the phase shift mask 44 is formed into a shifter top type structure in which the phase shifter 4 is disposed on the Cr layer 3 which is the light shielding pattern. Now, another example of the structure of the phase shift mask capable of performing a similar correction will now be described with reference to FIGS. 20 and 21. For example, a phase shift mask 52 is formed into a structure in which the phase shifter 4 is disposed under the Cr layer 3 for the light shield pattern, while the etching stopper 46 is disposed under the phase shifter 4. A phase shift mask 53 shown in FIG. 21 is formed into a double layer shifter structure in which a sub-shifter 55 is placed to cover the Cr layer 3 for the light shield pattern and the phase shifter 4 is disposed on the sub-shifter 55. Furthermore, the etching stopper 46 is disposed between the phase shifter 4 and the sub-shifter 55 and also the etching stopper 46 is disposed between the sub-shifter and the glass substrate 7. However, the present invention is not limited to the aforesaid structure. The phase shifter of the phase shift mask can be corrected when the etching stopper 46 is disposed between the phase shifter 4 and the glass substrate 1.

Figure 17A:
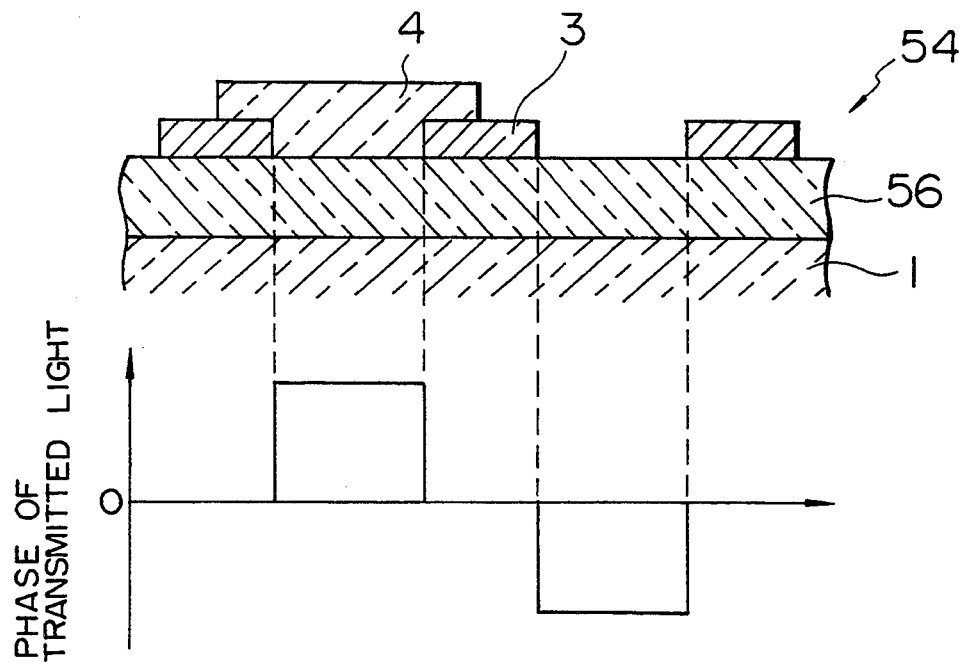
FIGS. 17A and 17B illustrate the structure of a third embodiment of the phase shift mask according to said another aspect of the present invention.
Figure 17B:
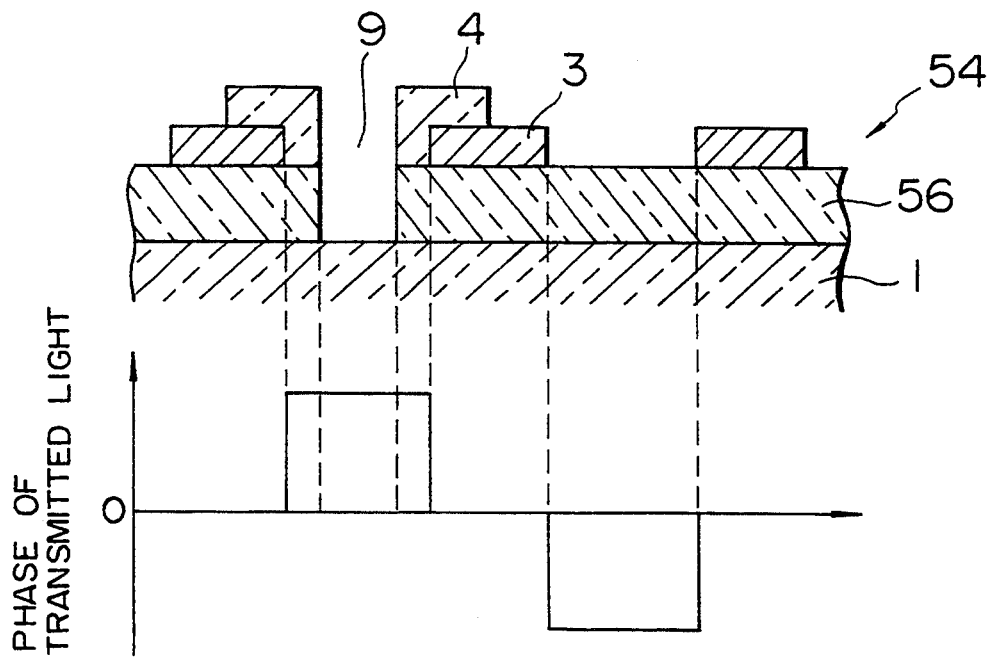

Although the etching stopper layer 46 according to each of the embodiments shown in FIGS. 13A to 13C and FIGS. 16A to 16D is made to be thin so as not to affect the phase of exposure light defined by the phase shifter 4, the etching stopper layer 56 according to the embodiment shown in FIGS. 17A and 17B also acts as a sub-shifter. That is, the etching stopper layer 56 is deposited on the glass substrate 1 by a thickness with which the phase of exposure light can be shifted by $\pi$. Furthermore, the light shield pattern 3 is deposited on the etching stopper layer 56 and the phase shifter 4 is deposited on a region corresponding to a region where the circuit pattern will be formed. Phases of exposure lights which have passed through the thus structured phase shift mask 54 are different by $\pi$, when one of the lights has passed through the normal phase shifter 4 and the etching stopper layer 56 and when another of the lights has simply passed through the etching stopper layer 56. Therefore, the resolution can be raised similarly to the aforesaid embodiments. If the mask 54 according to this embodiment has a lacking type defect in the phase shifter 4, it can be corrected by removing a defect portion of the phase shifter 4 and a portion of the etching stopper 56 which correspond to or is situated under the defective portion as shown in FIG. 17B as designated by a reference numeral 9.

Figure 18C:
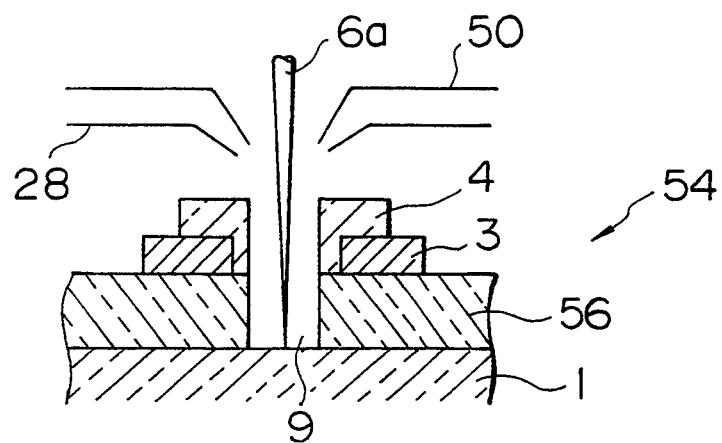
Figure 19A:
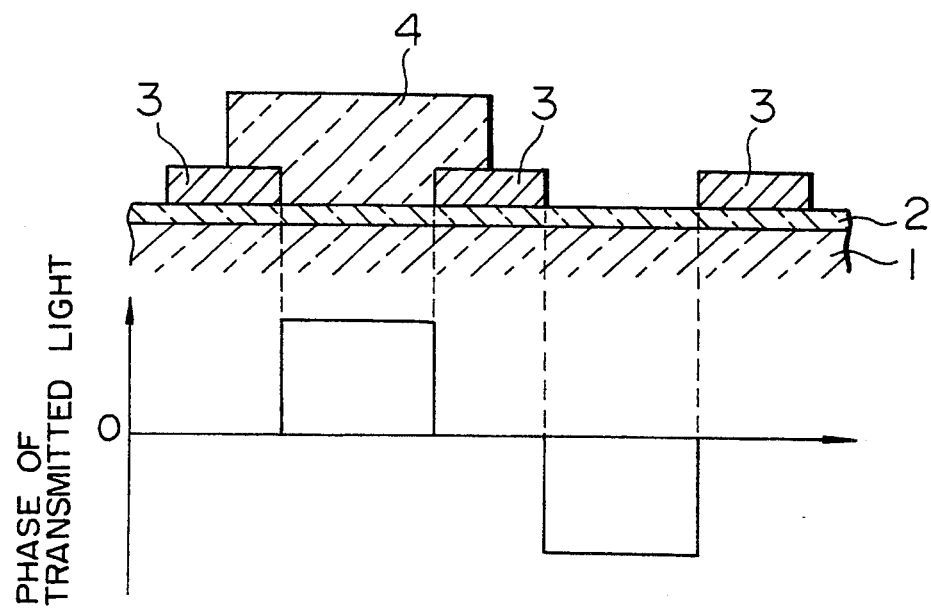
FIGS. 19A and 19B schematically illustrate a state of a defect of the phase shift mask.
Figure 19B:
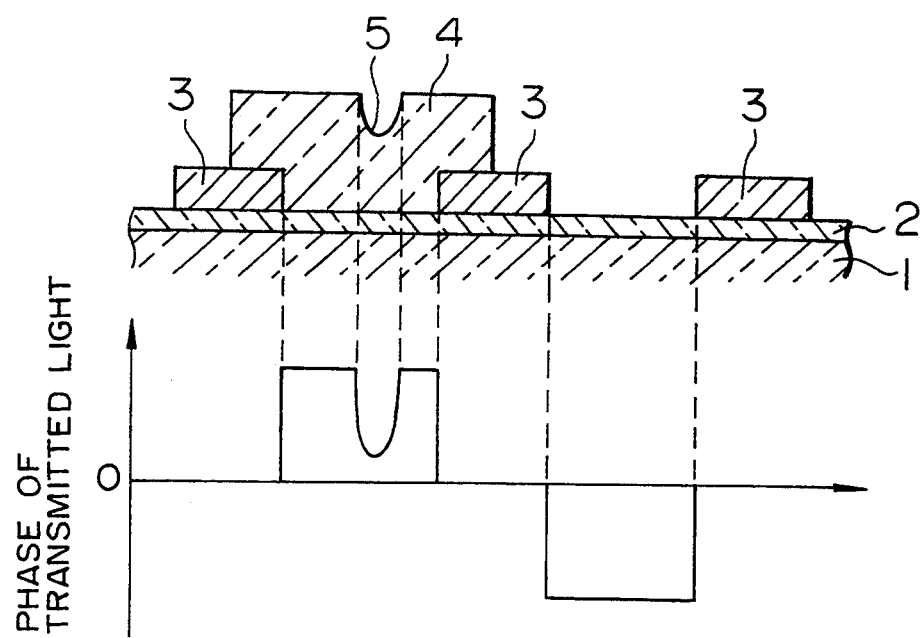

Then, a method of correcting a defect of a phase shifter of a phase shift mask according to the embodiment shown in FIGS. 17A and 17B will now be described with reference of FIGS. 18A to 18C. First, as shown in FIG. 18A, the gas 29 for selectively etching the phase shifter 4 with respect to the etching stopper layer 56 is supplied to remove the phase shifter 4 of the defective portion 5 while applying the focused ion beam 6a to the defective portion 5 on the phase shifter 4. Then, the supply of the etching gas 29 is stopped as shown in FIG. 18B and the gas 51 for selectively etching the etching stopper layer 56 with respect to the glass substrate 1 is supplied to remove the etching stopper layer 56. Another structure in which the nozzles 28 and 50 are commonly used may be employed. Thus, the correction of the defect 5 of the phase shifter 4 of the phase shift mask 54 is completed as shown in FIG. 18C. The etching gases 29 and 51 are the same as those employed in the embodiments shown in FIGS. 13A to 13C and FIGS. 16A to 16D. In this embodiment, etching can be selectively stopped at the surface of the glass substrate 1 by selectively supplying the etching gas and thereby the depth of machining can be easily controlled. Furthermore, the bottom surface of the machined portion can be formed flat. In this embodiment, in order to further improve the accuracy of the depth of machining, a detector for detecting secondary particles emitted by bombardment of the incident ion beam may be provided to monitor the material which is being machined.

Although the ion beam is used as the charged particle beam in each of the embodiments shown in FIGS. 13A to 13C, FIGS. 16A to 16D and FIGS. 18A to 18C, electron beam may be used instead of the ion beam to obtain a similar effect.

The etching stopper layers 46 and 56 enables another effect to be obtained in that damage of the glass substrate 1 is prevented when the phase shifter 4 is patterned by a method such as dry etching.

Although each of the etching stopper layers 46, 56 has been described to be made of single uniform layer, the etching stopper layer may have a multi-layer structure in which plural kinds of transparent layers are superposed.

As described above, according to said another aspect of the present invention, machining can be performed regardless of the shape of the defect of the phase shifter and thereby the accuracy of the depth of machining can be improved. Consequently the accuracy of correcting the defect of the phase shift mask can be improved and the manufacturing yield thereof can be enhanced.

What is claimed is:

1. A phase shift mask comprising:
   a transparent substrate; and
   a phase shifter disposed on said transparent substrate, said phase shifter being formed into a predetermined pattern and acting to shift a phase of exposure light transmitted therethrough by a predetermined magnitude;
   wherein an etching stopper layer which is resistant to an etching to which said phase shifter is subjected and transparent for the exposure light is disposed between said phase shifter and said transparent substrate; and
   wherein said etching stopper layer has a thickness corresponding to a negligible magnitude of an optical path for the exposure light as compared with the length of the optical path for the exposure light in said phase shifter.

2. A mask according to claim 1, wherein said etching stopper layer is made of a metal halide.

3. A mask according to claim 2, wherein said metal halide is a material selected from a group consisting essentially of $MgF_2$ and $CeF_3$.

4. A phase shift mask comprising:
a transparent substrate; and
a phase shifter disposed on said transparent substrate, said phase shifter being formed into a predetermined pattern and acting to shift a phase of exposure light transmitted therethrough by a predetermined magnitude;
wherein an etching stopper layer which is resistant to an etching to which said phase shifter is subjected and transparent for the exposure light is disposed between said phase shifter and said transparent substrate; and
wherein said etching stopper layer has a thickness corresponding to a magnitude of an optical path for exposure light which is the same as that of the optical path for said exposure light in said phase shifter.

5. A mask according to claim 4, wherein said etching stopper layer is made of a metal halide.

6. A mask according to claim 5, wherein said metal halide is a material selected from a group consisting essentially of $MgF_2$ and $CeF_3$.

7. A defect-corrected phase shift mask comprising:
a transparent substrate; and
a phase shifter disposed on said transparent substrate, said phase shifter being formed into a predetermined pattern and acting to shift a phase of exposure light transmitted therethrough by a predetermined magnitude;
wherein an etching stopper layer which is resistant to etching to which said phase shifter is subjected and transparent for the exposure light is disposed between said phase shifter and said transparent substrate, said etching stopper layer having a thickness corresponding to a negligible magnitude of an optical path for the exposure light as compared with the magnitude of the optical path for the exposure light in said phase shifter;
wherein said mask has a hole extending from an upper surface of said phase shifter into said substrate through said etching stopper layer, a depth of the hole corresponding to a magnitude of an optical path of the phase shifter for the exposure light; and
wherein said etching stopper layer is made of a material selected from a group consisting essentially of a metal oxide and a metal halide.

8. A method of correcting a defect of a phase shift mask, said phase shift mask having a phase shifter disposed on a transparent substrate and an etching stopper layer disposed between said phase shifter and said transparent substrate, said phase shifter being formed into a predetermined pattern and acting to shift a phase of exposure light transmitted therethrough, said etching stopper layer being resistant to an etching to which said phase shifter is subjected and transparent for the exposure light, said method comprising the steps of:
etching a defective portion of said phase shifter having a lacking-type defect selectively with respect to said etching stopper layer along a whole thickness of said phase shifter; and
perforating a portion of said etching stopper layer and said transparent substrate positioned under said etched defection portion by a depth which corresponds to a magnitude of an optical path of said phase shifter for exposure light;
wherein said step of etching the defect of said phase shifter is a reactive etching which uses a charged particle beam and a reactive gas and, in said etching step, the bottom surface of a portion etched is flattened by utilizing a fact that said phase shifter is selectively etched.

9. A method of correcting a defect of a mask according to claim 8, wherein said step of perforating said etching stopper includes a step in which a charged particle beam and a reactive gas for selectively etching said etching stopper layer with respect to said transparent substrate are used to selectively and chemically reactively etch the portion of said etching stopper layer under the defective portion of said phase shifter along the whole thickness of the stopper layer.

10. A method of correcting a defect of a mask according to claim 8, wherein said etching stopper layer is made of a material selected from a group consisting essentially of a metal oxide and a metal halide.

11. A method of correcting a defect of a mask according to claim 8, wherein said etching stopping layer is made of a metal halide selected from a group consisting essentially of $MgF_2$ and $CeF_3$.

12. A method of correcting a defect of a phase shift mask, said phase shift mask having a phase shifter disposed on a transparent substrate and an etching stopper layer disposed between said phase shifter and said transparent substrate, said phase shifter being formed into a predetermined pattern and acting to shift a phase of exposure light transmitted therethrough, said etching stopper layer being resistant to an etching to which said phase shifter is subjected and transparent for the exposure light, said method comprising the step of:
selectively etching a residual-type defective portion of said phase shifter, said residual-type defective portion being made of the material of said phase shifter and being deposited on said transparent substrate outside said predetermined pattern, said selective etching being chemically reactive etching which uses a charged particle beam and a reactive gas, a bottom surface of an etched portion being flattened by utilizing a fact that said phase shifter is selectively etched.

13. A method of correcting a defect of a mask according to claim 12, wherein said etching stopper layer is made of a material selected from a group consisting essentially of a metal oxide and a metal halide.

14. A method of correcting a defect of a mask according to claim 12, wherein said etching stopper layer is made of a metal halide selected from a group consisting essentially of $MgF_2$ and $CeF_3$.

15. A method of correcting a defect of a phase shift mask, said phase shift mask having a phase shifter disposed on a transparent substrate and an etching stopper layer disposed between said phase shifter and said transparent substrate, said phase shifter being formed into a predetermined pattern and acting to shift a phase of exposure light transmitted therethrough, said etching stopper layer being resistant to an etching to which said phase shifter is subjected and transparent for the exposure light, said method comprising the steps of:
selectively etching a defective portion of said phase shifter having a lacking-type defect with respect to said etching stopper layer along a whole thickness of said phase shifter; and selectively etching a portion of said etching stopper layer positioned under said etched defective portion with respect to said transparent substrate.

16. A method of machining, with a focused ion beam, a phase shift mask having a phase shifter disposed on a transparent substrate, formed into a predetermined pattern and acting to shift a phase of exposure light transmitted therethrough and an etching stopper layer disposed between said phase shifter and said transparent substrate, which is resistant to an etching to which said phase shifter is subjected and transparent for the exposure light, comprising steps of:

in order to correct a lacking type defect of said phase shifter, making a laser beam incident upon a surface of said mask which is being subjected to perforating with a focused ion beam;

obtaining an interfered light by allowing a light beam reflected, by said surface to be perforated, of said incident laser beam and a reference laser beam obtained by reflecting said incident laser beam at a reference surface which is different from said surface to be perforated to interfere with each other; and monitoring a depth of perforation by detecting a change in said interfered light during perforating.

17. A method of correcting a phase shift mask having a transparent substrate and a phase shifter disposed on said transparent substrate and formed into a predetermined pattern, said phase shifter having a lacking-type defect, said method comprising the step of:

raising the refraction index of a lower region of said phase mask under the defect.

18. A mask correcting method according to claim 17, wherein said refraction index raising step is performed by implanting ions into said lower region by applying an ion beam to said lower region.

19. A mask correcting method according to claim 17, wherein said refraction index raising step is performed by generating thermal strain in said lower region by applying a beam for providing thermal energy to said lower region.

20. A mask correcting method according to claim 17, wherein said lower region is a region of said phase shifter positioned in a bottom portion of the lacking-type defect of said phase shifter.

21. A mask correcting method according to claim 20, wherein the bottom portion of the lacking-type defect is etched until it is made substantially flat, and a portion of said phase shifter which forms said flattened bottom portion is subjected to said refraction index raising.

22. A mask correcting method according to claim 17, wherein a portion of said phase shifter positioned below the lacking-type defect is removed by etching, and a portion of said transparent substrate which is exposed due to said removal is subjected to said refraction index raising.

23. A mask correcting method according to claim 22, wherein said transparent substrate includes a transparent conductive layer, and said transparent conductive layer is subjected to said refraction index raising at said portion of said transparent substrate which is exposed.

24. A phase shift mask comprising:

a transparent substrate; and a phase shifter disposed on said transparent substrate, said phase shifter being formed into a predetermined pattern and acting to shift a phase of exposure light transmitted therethrough;

wherein one of said transparent substrate and said phase shifter partially includes a portion the refraction index of which has been changed.

25. A mask according to claim 24, wherein said transparent substrate includes a transparent conductive layer.

* * * * *